US009577156B2

(12) United States Patent
Totani

(10) Patent No.: US 9,577,156 B2
(45) Date of Patent: Feb. 21, 2017

(54) GROUP III NITRIDE SEMICONDUCTOR LIGHT-EMITTING DEVICE AND PRODUCTION METHOD THEREFOR

(71) Applicant: TOYODA GOSEI CO., LTD., Kiyosu-shi (JP)

(72) Inventor: Shingo Totani, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 14/852,535

(22) Filed: Sep. 12, 2015

(65) Prior Publication Data

US 2016/0079467 A1  Mar. 17, 2016

(30) Foreign Application Priority Data

Sep. 16, 2014 (JP) ................................. 2014-187778

(51) Int. Cl.
*H01L 33/30* (2010.01)
*H01L 33/42* (2010.01)
(Continued)

(52) U.S. Cl.
CPC .......... *H01L 33/42* (2013.01); *H01L 33/0095* (2013.01); *H01L 33/32* (2013.01); *H01L 33/44* (2013.01); *H01L 33/38* (2013.01); *H01L 33/405* (2013.01); *H01L 33/46* (2013.01); *H01L 2933/0016* (2013.01)

(58) Field of Classification Search
USPC ........................................................ 257/76
See application file for complete search history.

(56) References Cited

U.S. PATENT DOCUMENTS

2009/0020776 A1* 1/2009 Lin ....................... H01L 33/382
257/98
2011/0024784 A1* 2/2011 Song ....................... H01L 33/44
257/98
(Continued)

FOREIGN PATENT DOCUMENTS

JP 2006-024750 A 1/2006
JP 2007-080899 A 3/2007
(Continued)

*Primary Examiner* — Andy Huynh
*Assistant Examiner* — Sitaramarao S Yechuri
(74) *Attorney, Agent, or Firm* — McGinn IP Law Group, PLLC

(57) ABSTRACT

The present invention provides a Group III nitride semiconductor light-emitting device in which the production method is simplified while migration of at least one of Ag atoms and Al atoms is suppressed, and a production method therefor. The production method comprises steps of forming a first electrode, forming a second electrode, and forming a second electrode side barrier metal layer on the second electrode. Moreover, the second electrode has an electrode layer containing at least one of Ag and Al. In forming the first electrode and the second electrode side barrier metal layer, the second electrode side barrier metal layer is formed on the second electrode while the first electrode to be electrically connected to the first semiconductor layer is formed. The first electrode and the second electrode side barrier metal layer are deposited are deposited in the same layered structure.

11 Claims, 15 Drawing Sheets

(51) Int. Cl.
*H01L 33/32* (2010.01)
*H01L 33/00* (2010.01)
*H01L 33/44* (2010.01)
H01L 33/46 (2010.01)
H01L 33/38 (2010.01)
H01L 33/40 (2010.01)

(56) References Cited

U.S. PATENT DOCUMENTS

| | | | |
|---|---|---|---|
| 2012/0018766 A1* | 1/2012 | Emura | H01L 33/38 257/99 |
| 2012/0049154 A1* | 3/2012 | Schubert | H01L 33/382 257/13 |
| 2013/0221372 A1* | 8/2013 | Lee | H01L 24/17 257/76 |
| 2015/0060879 A1* | 3/2015 | Zheng | H01L 33/405 257/76 |

FOREIGN PATENT DOCUMENTS

| | | |
|---|---|---|
| JP | 2011-187679 A | 9/2011 |
| JP | 2012-227383 A | 11/2012 |
| JP | 2013-239699 A | 11/2013 |

* cited by examiner

GROUP III NITRIDE SEMICONDUCTOR LIGHT-EMITTING DEVICE AND PRODUCTION METHOD THEREFOR

BACKGROUND OF THE INVENTION

Field of the Invention

The technical field of the present invention relates to a Group III nitride semiconductor light-emitting device and a production method therefor. More specifically, it relates to a Group III nitride semiconductor light-emitting device exhibiting suppression of metal migration and a production method therefor.

Background Art

In the Group III nitride semiconductor light-emitting device, a p-electrode or an n-electrode is formed of a metal. Metal includes, for example, Ag or Al which causes migration. Migration refers to a phenomenon in which metal atoms contained in a metal material transfer to the surface or the inside of other material such as insulating member when an electric field is applied to a metal material. Therefore, techniques of suppressing metal migration have been developed.

Japanese Patent Application Laid-Open (kokai) No. 2006-24750 discloses a light-emitting device 8 having an n-type layer 2, a light-emitting layer 3, a p-type layer 4, a thin film 7a formed of Pt on the p-type layer 4, an Ag alloy layer 7b on the thin film 7a, a barrier metal layer 7c on the Ag alloy layer 7b, and a p-side bonding layer 7d on the barrier metal layer 7c (refer to paragraphs [0029]-[0078] and FIG. 1). Thereby, Ag migration can be suppressed (refer to paragraphs [0021]-[0023]).

When the barrier metal layer is formed in this way, the method for producing a semiconductor light-emitting device has a step of forming a barrier metal layer. Therefore, a number of steps are required for that step.

On the other hand, the number of steps of the production method is preferably as small as possible. The smaller the number of steps, the shorter the cycle time. That is, the cost can be reduced by reducing the number of steps.

However, a light-emitting device in which migration of Ag atoms or Al atoms is not suppressed, has a short lifetime. Therefore, it is preferable to simplify the production process while suppressing migration of metal atoms.

SUMMARY OF THE INVENTION

The present invention has been conceived in order to solve the aforementioned technical problems involved in the conventional techniques. Thus, an object of the present invention is to provide a Group III nitride semiconductor light-emitting device in which the production process is simplified while migration of at least one of Ag atoms and Al atoms is suppressed, and a method therefor.

In a first aspect of the present technique, there is provided a method for producing a Group III nitride semiconductor light-emitting device comprising a first conduction type first semiconductor layer, a light-emitting layer, and a second conduction type second semiconductor layer, the method comprising:

a first electrode formation step of forming a first electrode to be electrically connected to the first semiconductor layer;

a second electrode formation step of forming a first electrode to be electrically connected to the second semiconductor layer; and a second electrode side barrier metal formation step of forming a second electrode side barrier metal on the second electrode.

The second electrode has an electrode layer containing at least one of Ag and Al. In the first electrode formation step and the second electrode side barrier metal formation step, the second electrode side barrier metal layer is formed on the second electrode while the first electrode to be electrically connected to the first semiconductor layer is formed. The first electrode and the second electrode side barrier metal layer are deposited in the same layered structure.

In the method for producing the Group III nitride semiconductor light-emitting device, the first electrode formation step and the second electrode side barrier metal layer formation step are combined into one step. That is, both the first electrode and the second electrode side barrier metal layer can be formed by performing the same step once. Therefore, the number of steps is smaller than that when the first electrode and the second electrode side barrier metal layer are formed separately. The cycle time of producing a semiconductor light-emitting device is short. Thus-produced semiconductor light-emitting device has a second electrode with a reflective film. Therefore, the second electrode suitably reflects the light emitted from the light-emitting layer toward the semiconductor layer. Thus, the light is hardly absorbed by the other layers of the second electrode or the second electrode side barrier metal layer. That is, the semiconductor light-emitting device has high extraction efficiency.

A second aspect of the technique is drawn to a specific mode of the method for producing the Group III nitride semiconductor light-emitting device, the method comprising a first metal layer formation step of forming a first metal layer between the first semiconductor layer and the first electrode. In the first metal layer formation step and the second electrode formation step, the second electrode is formed while the first metal layer is formed, and the first metal layer and the second electrode are deposited in the same layered structure.

A third aspect of the technique is drawn to a specific mode of the method for producing the Group III nitride semiconductor light-emitting device, wherein the first semiconductor layer is an n-type semiconductor layer, and the second semiconductor layer is a p-type semiconductor layer. The first electrode is an n-electrode, and the second electrode is a p-electrode. The first electrode formation step is the n-electrode formation step. The second electrode side barrier metal layer formation step is a p-side barrier metal layer formation step. The n-electrode formation step includes a p-side barrier metal layer formation step of forming a p-side barrier metal layer on a p-electrode. The p-electrode has an electrode layer containing at least one of Ag and Al. In the n-electrode formation step and the p-side barrier metal layer formation step, the p-side barrier metal layer is formed on the p-electrode while the n-electrode is formed on the n-type semiconductor layer. The n-electrode and the p-side barrier metal layer are deposited in the same layered structure.

A fourth aspect of the technique is drawn to a specific mode of the method for producing the Group III nitride semiconductor light-emitting device, wherein the first semiconductor layer is a p-type semiconductor layer, and the second semiconductor layer is an n-type semiconductor layer. The first electrode is a p-electrode, and the second electrode is an n-electrode. The first electrode formation step is the p-electrode formation step. The second electrode side barrier metal layer formation step is an n-side barrier metal layer formation step. The p-electrode formation step includes an n-side barrier metal layer formation step of forming an n-side barrier metal layer on an n-electrode. The n-electrode has an electrode layer containing at least one of Ag and Al. In the p-electrode formation step and the n-side barrier metal layer formation step, the n-side barrier metal layer is formed on the n-electrode while the p-electrode is formed on the p-type semiconductor layer or the transparent electrode on the p-type semiconductor layer. The p-electrode and the n-side barrier metal layer are deposited in the same layered structure.

A fifth aspect of the technique is drawn to a specific mode of the method for producing the Group III nitride semiconductor light-emitting device, the method comprising a transparent electrode formation step of forming a transparent electrode on the p-type semiconductor layer.

A sixth aspect of the technique is drawn to a specific mode of the method for producing the Group III nitride semiconductor light-emitting device, the method comprising an insulating layer formation step of forming an insulating layer on the transparent electrode, and a current blocking layer formation step of forming at least one current blocking layer on a portion of the p-type semiconductor layer, wherein the p-electrode is formed on the insulating layer and contacts with the transparent electrode through the contact space, and the portion in which the current blocking layer is formed is under the contact space.

A seventh aspect of the technique is drawn to a specific mode of the method for producing the Group III nitride semiconductor light-emitting device, the method comprising forming another insulating layer with another contact space on the n-type semiconductor layer, wherein the n-electrode is formed on the insulating layer and contacts with the n-type semiconductor layer through the contact space.

An eighth aspect of the technique is drawn to a specific mode of the method for producing the Group III nitride semiconductor light-emitting device, wherein the insulating layer formation step is a step of forming a distributed Bragg reflector as an insulating layer.

A ninth aspect of the technique is drawn to a specific mode of the method for producing the Group III nitride semiconductor light-emitting device, wherein the second electrode side barrier metal layer comprises at least one set selected from a group consisting of a set of Ti, Al alloy, Ta, Ti, Pt, Au, and Al and a set of Ti, Rh, Ti, Au, and Al, deposited in this order on the p-electrode.

A tenth aspect of the technique is drawn to a specific mode of the method for producing the Group III nitride semiconductor light-emitting device, wherein the second electrode side barrier metal layer comprises a set of Ti, Rh, Ti, Au, Al deposited in this order on the n-electrode.

In an eleventh aspect of the present technique, there is provided a Group III nitride semiconductor light-emitting device comprising:
a first conduction type first semiconductor layer;
a light-emitting layer on the first semiconductor layer;
a second conduction type second semiconductor layer on the light-emitting layer;
a first electrode electrically connected to the first semiconductor layer; and
a second electrode electrically connected to the second semiconductor layer.

The light-emitting device has a second electrode side barrier metal layer on the second electrode. The second electrode has an electrode layer containing at least one of Ag and Al. The second electrode side barrier metal layer has the same layered structure as that of the first electrode.

In a twelfth aspect of the present technique, there is provided a Group III nitride semiconductor light-emitting device, wherein the first electrode has a first pad electrode, and the second electrode side barrier metal layer has a second pad electrode.

The present specification provides a Group III nitride semiconductor light-emitting device in which the production method is simplified while migration of at least one of Ag atoms and Al atoms is suppressed, and a production method therefor.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Figure 1:
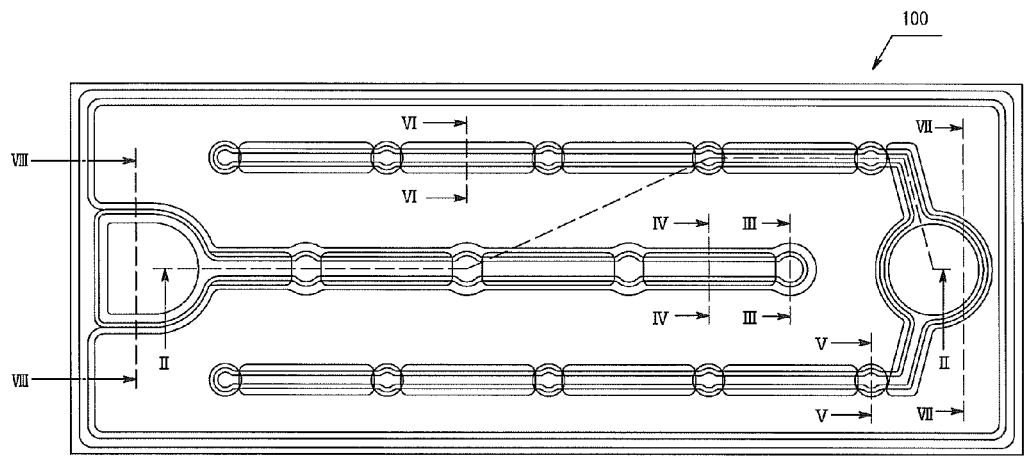
FIG. 1 is a plan view showing the structure of a light-emitting device according to Embodiment 1.

Specific embodiments of the semiconductor light-emitting device and the production method therefor will next be described, with reference to the drawings. However, the embodiments should not be construed as limiting the techniques thereto. The layered structure of the below-described semiconductor light-emitting device and the electrode structure thereof are merely examples, and a layered structure other than those of the embodiments may also be employed. The thickness of each of the layers shown in the drawings is a conceptual thickness, which is not an actual thickness.

Embodiment 1

1. Semiconductor Light-Emitting Device

Figure 2:
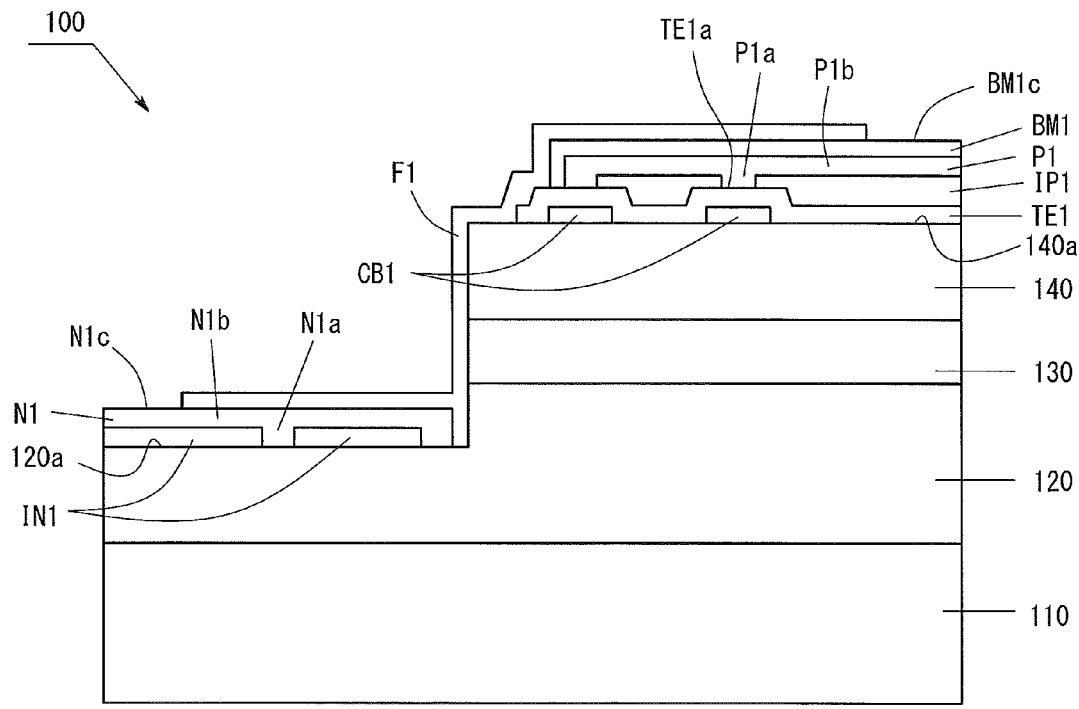
FIG. 2 is a cross-sectional view showing an II-II cross section of FIG. 1.

FIG. 1 is a plan view showing the structure of a light-emitting device 100 according to Embodiment 1. FIG. 2 is a cross-sectional view showing an II-II cross section of FIG. 1. The light-emitting device 100 is a face-up type semiconductor light-emitting device. The light-emitting device 100 has a plurality of semiconductor layers. As shown in FIGS. 1 and 2, the light-emitting device 100 has a substrate 110, an n-type semiconductor layer 120, a light-emitting layer 130, a p-type semiconductor layer 140, an insulating layer IN1, an n-electrode N1, a current blocking layer CB1, a transparent electrode TE1, an insulating layer IP1, a p-electrode P1, a p-side barrier metal layer BM1, and a protective film F1.

As shown in FIG. 2, the main surface of the substrate 110, the n-type semiconductor layer 120, the light-emitting layer 130, and the p-type semiconductor layer 140 are formed in this order. The transparent electrode TE1 is formed on the p-type semiconductor layer 140. The p-electrode P1 is formed on the transparent electrode TE1. The n-electrode N1 is formed on the n-type semiconductor layer 120.

The n-electrode N1 is electrically connected to the n-type semiconductor layer 120. The n-electrode N1 has an re-contact electrode N1a, an n-wiring electrode N1b, and an n-pad electrode N1c. The n-contact electrode N1a of the n-electrode N1 is in contact with a portion of a first surface 120a of the n-type semiconductor layer 120. The insulating layer IN1 is in contact with the remaining portion of the first surface 120a of the n-type semiconductor layer 120. The n-wiring electrode N1b is a comb-shaped electrode. The n-pad electrode N1c is a first pad electrode which is electrically connected to an external electrode of the device. The n-pad electrode N1c is exposed without being covered with a protective film F1.

The p-electrode P1 is electrically connected to the p-type semiconductor layer 140. The p-electrode P1 has a p-contact electrode P1a and a p-wiring electrode P1b. The p-contact electrode P1a of the p-electrode P1 is in contact with a portion of a first surface TE1a of the transparent electrode TE1. The insulating layer IP1 is in contact with the remaining portion of the first surface TE1a of the transparent electrode TE1. The p-wiring electrode P1b is a comb-shaped electrode.

The substrate 110 is a growth substrate. On the main surface of the substrate 110, the aforementioned semiconductor layers are formed through MOCVD. The main surface of the substrate 110 is preferably roughened. The substrate 110 is made of sapphire. Other than sapphire, materials such as SiC, ZnO, Si, GaN, and AlN may be employed.

The n-type semiconductor layer 120 is formed on the substrate 110. A buffer layer may be formed between the substrate 110 and the n-type semiconductor layer 120. The n-type semiconductor layer 120 is in contact with the n-electrode N1. Thus, the n-type semiconductor layer 120 is electrically connected to the n-electrode N1.

The light-emitting layer 130 emits light through recombination of an electron with a hole. The light-emitting layer 130 is formed on the n-type semiconductor layer 120. The light-emitting layer 130 has at least a well layer and a barrier layer. The well layer may be, for example, an InGaN layer or a GaN layer. The barrier layer may be, for example, a GaN layer or an AlGaN layer. These layers are examples, and other layers such as an AlInGaN layer may be employed.

The p-type semiconductor layer 140 is formed on the light-emitting layer 130. The p-type semiconductor layer 140 is in contact with the transparent electrode TE1. That is, the p-type semiconductor layer 140 is electrically connected to the p-electrode P1 through the transparent electrode TE1.

The transparent electrode TE1 is an electrode layer which is electrically connected to the p-type semiconductor layer 140, and transmits light. The transparent electrode TE1 is formed of IZO.

The p-electrode P1 serves as both a contact electrode and a reflective film. The p-electrode P1 has an electrode layer containing at least one of Ag and Al. The electrode layer is a reflective electrode layer having a thickness of 50 nm or more, and formed of Ag or Al, or an alloy of these materials. The reflective electrode layer is a layer to reflect light. The thickness of the reflective electrode layer is preferably 50 nm to suitably reflect light.

The p-side barrier metal layer BM1 suppresses migration of Ag or Al in the electrode layer having a thickness of 50 nm or more and formed of Ag or Al, or an alloy of these materials of the p-electrode P1. For that purpose, the p-type barrier metal layer BM1 and the transparent electrode TE1 cover the p-electrode P1. The p-side barrier metal layer BM1 has a p-pad electrode BM1c. The p-pad electrode BM1c is a second pad electrode to be electrically connected to an external electrode of the device. The p-pad electrode BM1c is exposed without being covered with the protective film F1.

2. Structure in the Vicinity of Electrode

2-1. Structure in the Vicinity of n-Electrode

Figure 3:
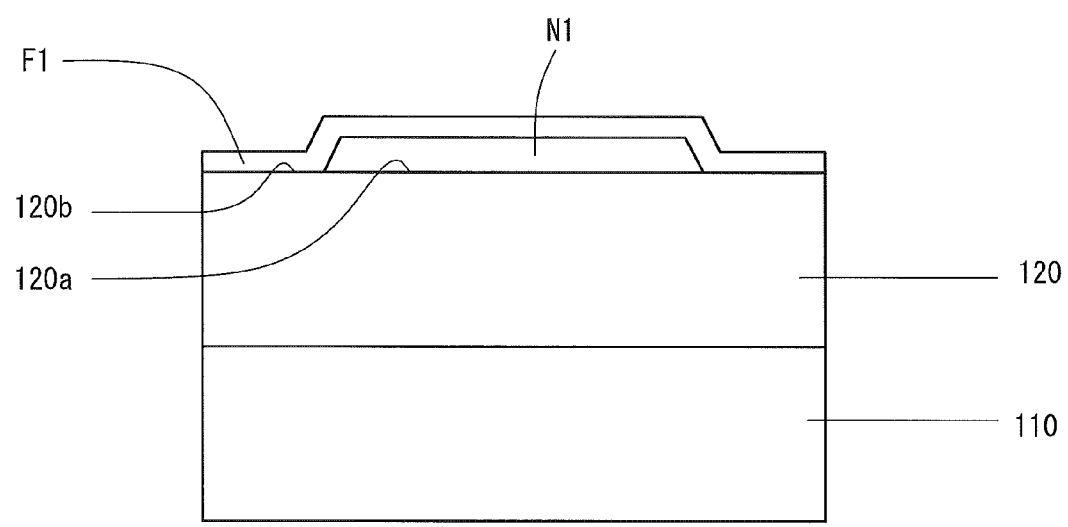
FIG. 3 is a cross-sectional view showing an III-III cross section of FIG. 1.

FIG. 3 is a cross-sectional view showing an III-III cross section of FIG. 1. As shown in FIG. 3, the n-electrode N1 is formed on a portion 120a of the n-type semiconductor layer 120. The protective film F1 is formed on the n-electrode N1 and the remaining portion 120b of the n-type semiconductor layer 120. The material of the n-electrode N1 will be described later. The protective film F1 is formed of, for example, $SiO_2$. The protective film F1 may be formed of any insulating transparent film other than the $SiO_2$ film.

Figure 4:
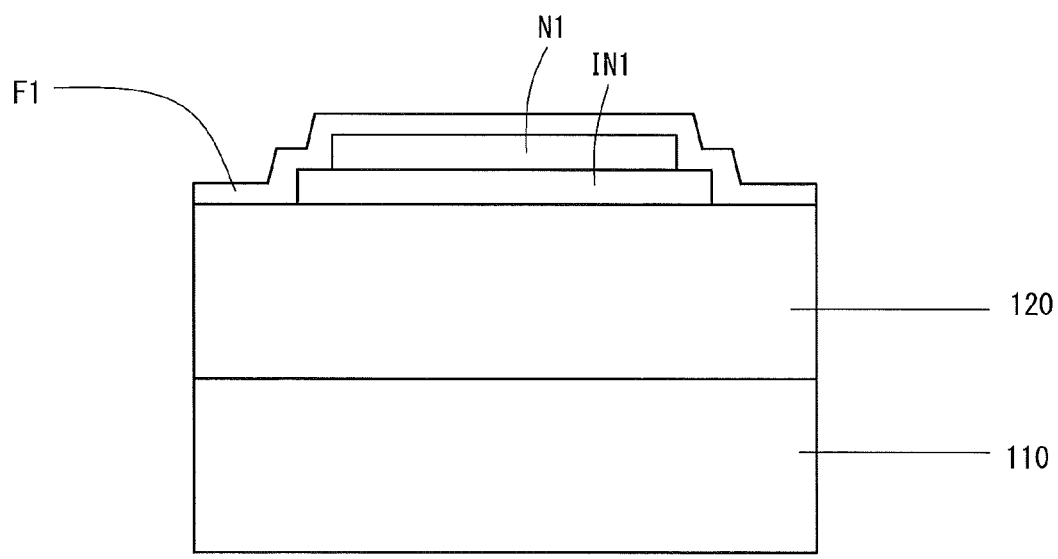
FIG. 4 is a cross-sectional view showing an IV-IV cross section of FIG. 1.

FIG. 4 is a cross-sectional view showing an IV-IV cross section of FIG. 1. As shown in FIG. 4, the insulating layer IN1 is formed on the n-type semiconductor layer 120. The n-electrode N1 is formed on the insulating layer IN1.

2-2. Structure in the Vicinity of p-Electrode

Figure 5:
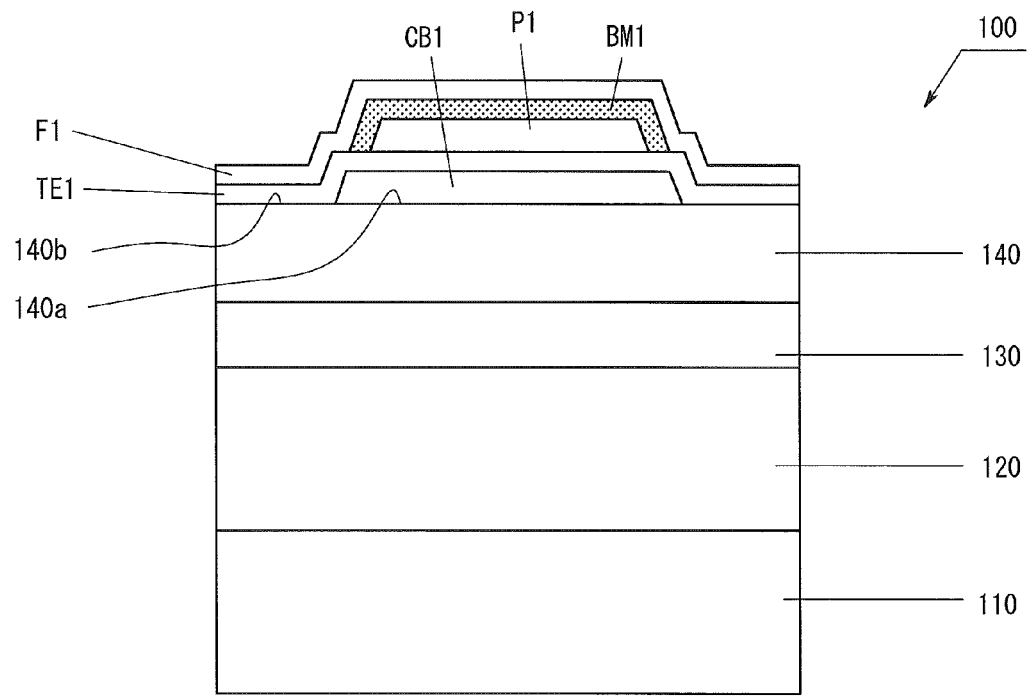
FIG. 5 is a cross-sectional view showing a V-V cross section of FIG. 1.

FIG. 5 is a cross-sectional view showing a V-V cross section of FIG. 1. As shown in FIG. 5, the current blocking layer CB1 is disposed on a portion 140a of the p-type semiconductor layer 140. The transparent electrode TE1 is disposed on the current blocking layer CB1 and the remaining portion 140b of the p-type semiconductor layer 140. The p-electrode P1 is disposed on the transparent electrode TE1. When the p-electrode P1 is projected to the surface of the p-type semiconductor layer 140, its projection region is included in an area where the current blocking layer CB1 is formed.

The p-side barrier metal layer BM1 is disposed on the p-electrode P1. The p-side barrier metal layer BM1 completely covers the surface of the p-electrode P1. That is, the p-side barrier metal layer BM1 and the transparent electrode TE1 completely cover the p-electrode P1. The protective film F1 covers the entire part on the p-type semiconductor layer 140 side. The protective film F1 covers the transparent electrode TE1 and the p-side barrier metal layer BM1.

Figure 6:
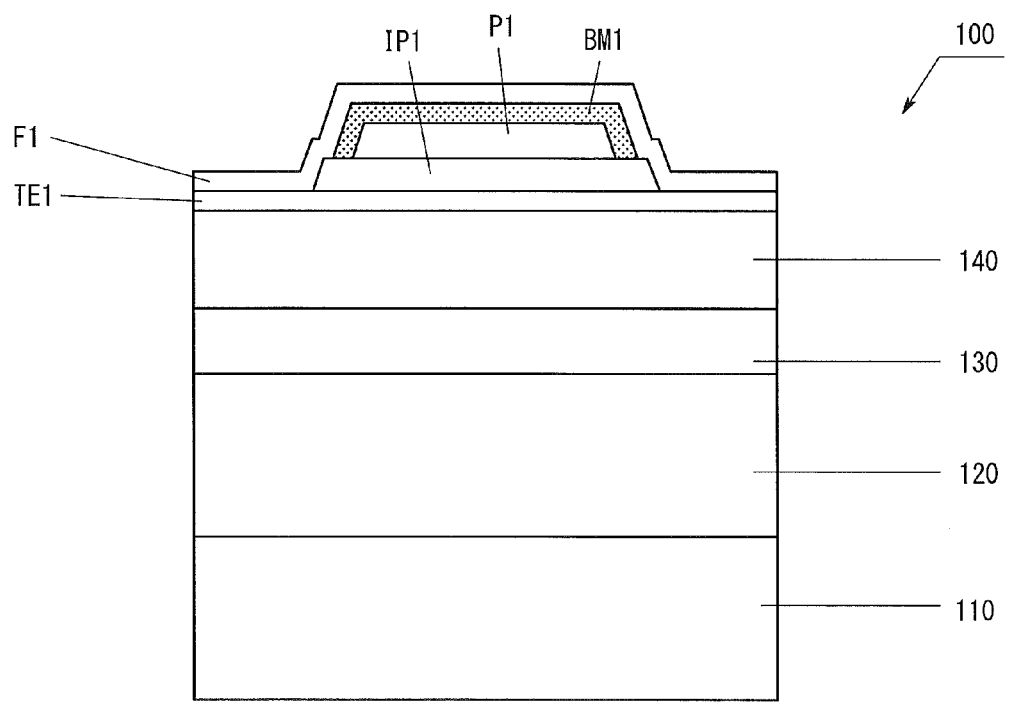
FIG. 6 is a cross-sectional view showing a VI-VI cross section of FIG. 1.

FIG. 6 is a cross-sectional view showing a VI-VI cross section of FIG. 1. As shown in FIG. 6, in this cross section, the insulating layer IP1 is formed on the transparent electrode TE1. Therefore, in this cross section, the p-electrode P1 is not in contact with the transparent electrode TE1.

Figure 7:
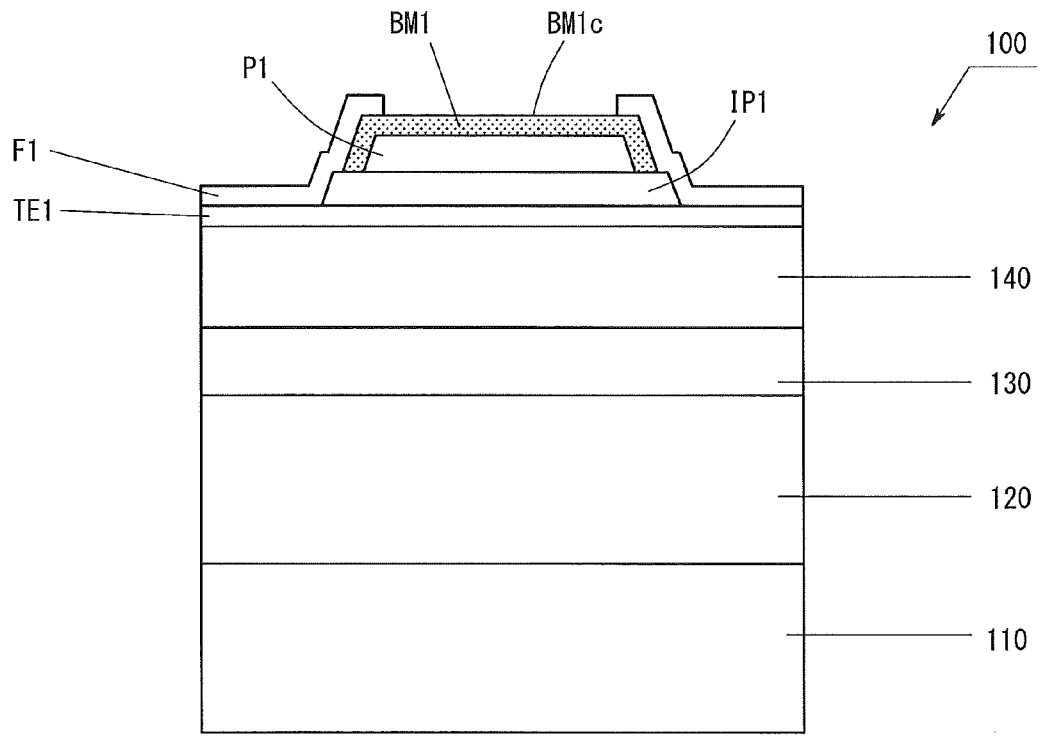
FIG. 7 is a cross-sectional view showing a VII-VII cross section of FIG. 1.

FIG. 7 is a cross-sectional view showing a VII-VII cross section of FIG. 1. This cross section includes the p-pad electrode BM1c. As shown in FIG. 7, in this cross section, the insulating layer IP1 is formed on the transparent electrode TE1. Therefore, in this cross section, the p-electrode P1 is not in contact with the transparent electrode TE1. Current does not flow from the p-pad electrode BM1c directly to the transparent electrode TE1, but flows to the p-wiring electrode P1b and through the p-contact electrode P1a to the transparent electrode TE1.

Figure 8:
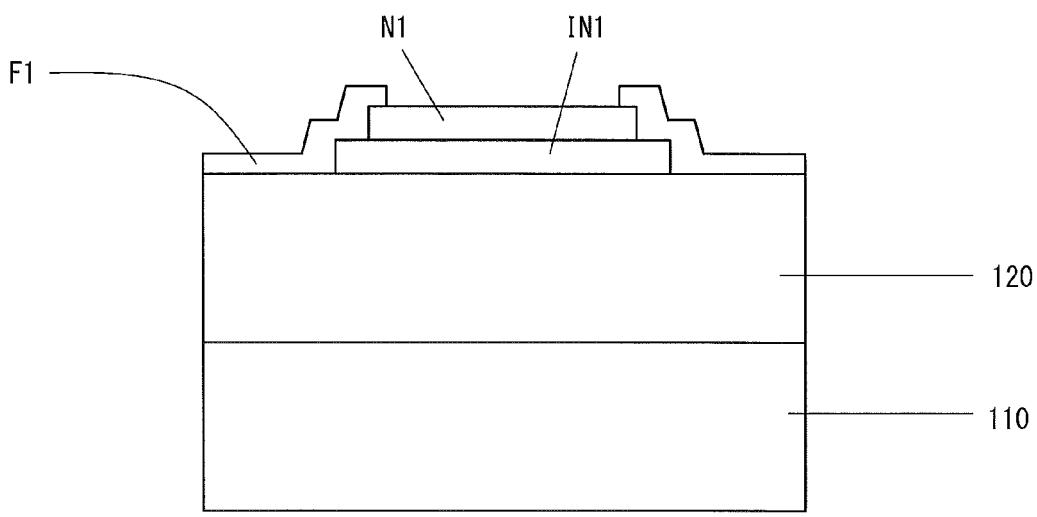
FIG. 8 is a cross-sectional view showing a VIII-VIII cross section of FIG. 1.

FIG. 8 is a cross-sectional view showing a VIII-VIII cross section of FIG. 1. As shown in FIG. 8, the insulating layer IN1 is formed on the n-type semiconductor layer 120. The n-electrode N1 is formed on the insulating layer IN1.

3. p-Side Barrier Metal Layer and n-Electrode

3-1. Layered Structure of p-Side Barrier Metal Layer and n-Electrode

As shown by the hatched area of FIG. 5, the layered structure of the p-side barrier metal layer BM1 in FIG. 5 is the same as the layered structure of the n-electrode N1 in FIG. 3. As described later, the p-side barrier metal layer BM1 and the n-electrode N1 are formed in the same step. In the p-side barrier metal layer BM1 and the n-electrode N1, the layers are formed in the same order sequentially from the lower layer, and the thickness of each of the layers deposited is also the same within the film formation error range. That is, the p-side barrier metal layer BM1 and the n-electrode N1 have the same layered structure.

3-2. Materials of p-Side Barrier Metal Layer and n-Electrode

3-2-1. Example 1

Next will be described materials of the p-electrode P1, the p-side barrier metal layer BM1, and the n-electrode N1. In Example 1 of Table 1, the p-electrode P1 is formed of α-IZO, Ag alloy, Ta, and Ti deposited in this order on the transparent electrode TE1. The thickness of α-IZO is 5 nm. The thickness of Ag alloy is 100 nm. The thickness of Ta is 100 nm. The thickness of Ti is 50 nm. The thicknesses of these layers are merely examples. The thicknesses are not limited to these. Ag alloy is, for example, an alloy containing Ag, Pd, and Cu. Needless to say, any alloy having other composition may also be employed.

The p-side barrier metal layer BM1 is formed of Ti, Al alloy, Ta, Ti, Pt, Au, and Al deposited in this order on the p-electrode P1. The thickness of Ti is 2 nm. The thickness of Al alloy is 100 nm. The thickness of Ta is 100 nm. The thickness of Ti is 300 nm. The thickness of Pt is 100 nm. The thickness of Au is 1,500 nm. The thickness of Al is 10 nm. The thicknesses of these layers are merely examples. The thicknesses are not limited to these. Al alloy is, for example, an alloy containing Al and Nd. Needless to say, any alloy having other composition may also be employed.

The n-electrode N1 of Example 1 is deposited in the same order as that of the p-side barrier metal layer BM1 of Example 1. The n-electrode N1 is formed of Ti, Al alloy, Ta, Ti, Pt, Au, and Al deposited in this order on the n-type semiconductor layer 120. The thickness of Ti is 2 nm. The thickness of Al alloy is 100 nm. The thickness of Ta is 100 nm. The thickness of Ti is 300 nm. The thickness of Pt is 100 nm. The thickness of Au is 1,500 nm. The thickness of Al is 10 nm. The thicknesses of these layers are merely examples. The thicknesses are not limited to these.

3-2-2. Example 2

In Example 2 of Table 1, the p-electrode P1 is the same as in Example 1.

The p-side barrier metal layer BM1 is formed of Ti, Rh, Ti, Au, and Al deposited in this order on the p-electrode P1. The thickness of Ti is 2 nm. The thickness of Rh is 100 nm. The thickness of Ti is 50 nm. The thickness of Au is 1,500 nm. The thickness of Al is 10 nm. The thicknesses of these layers are merely examples. The thicknesses are not limited to these.

The n-electrode N1 of Example 2 is deposited in the same order as that of the p-side barrier metal layer BM1 of Example 2.

3-2-3. Example 3

In Example 3 of Table 1, the p-electrode P1 is formed of Cr, Al alloy, Cr, and Ti deposited in this order on the transparent electrode TE1. The thickness of Cr in contact with the transparent electrode TE1 is 2 nm. The thickness of Al alloy is 100 nm. The thickness of Cr is 10 nm. The thickness of Ti is 50 nm. The thicknesses are merely examples. The thicknesses are not limited to these.

The p-side barrier metal layer BM1 of Example 3 is the same as the p-side barrier metal layer BM1 of Example 3.

The n-electrode N1 of Example 3 is deposited in the same order as that of the p-side barrier metal layer BM1 of Example 3.

TABLE 1

|  |  | p-electrode | p-side barrier metal layer and n-electrode |
|---|---|---|---|
| Example 1 | Material | α-IZO/Ag alloy/Ta/Ti | Ti/Al alloy/Ta/Ti/Pt/Au/Al |
|  | Thickness (nm) | 5/100/100/50 | 2/100/100/300/100/1500/10 |
| Example 2 | Material | α-IZO/Ag alloy/Ta/Ti | Ti/Rh/Ti/Au/Al |
|  | Thickness (nm) | 5/100/100/50 | 2/100/50/1500/10 |
| Example 3 | Material | Cr/Al alloy/Cr/Ti | Ti/Rh/Ti/Au/Al |
|  | Thickness (nm) | 2/100/10/50 | 2/100/50/1500/10 |

4. Effect of p-Side Barrier Metal Layer and n-Electrode

Migration of Ag alloy or Al alloy in the p-electrode P1 is suppressed because it is covered with the p-side barrier metal layer BM1. Ag alloy or Al alloy reflects the light emitted from the light-emitting layer 130 toward the semiconductor layer.

In these examples, there is no possibility of migration of Al in contact with Au. Al is in contact with Au having a lower electric resistivity than that of Al. Therefore, no current flows through Al in contact with Au. This hardly causes migration. Al in contact with Au is thin enough not to cause migration.

5. Method for Producing Semiconductor Light-Emitting Device

Next will be described a method for producing a light-emitting device 100 according to Embodiment 1. In Embodiment 1, the light-emitting device 100 comprises a first conduction type first semiconductor layer, a light-emitting layer, and a second conduction type second semiconductor layer, wherein the semiconductor crystal layers are formed through epitaxial growth based on metalorganic chemical vapor deposition (MOCVD). Accordingly, the production method comprises a first electrode formation step of forming a first electrode to be electrically connected to the first semiconductor layer, and a second electrode formation step of forming a second electrode to be electrically connected to the second semiconductor layer.

The production method also comprises a second electrode side barrier metal layer formation step of forming a second electrode side barrier metal layer on the second electrode. The second electrode has an electrode layer containing at least one of Ag and Al. In the first electrode formation step and the second electrode side barrier metal layer formation step, the second electrode side barrier metal layer is formed on the second electrode while the first electrode to be electrically connected to the first semiconductor layer is formed. The first electrode and the second electrode side barrier metal layer are deposited in the same layered structure.

Examples of the carrier gas employed in the growth of semiconductor layers include hydrogen ($H_2$), nitrogen ($N_2$), and a mixture of hydrogen and nitrogen ($H_2+N_2$). In the steps described later, unless otherwise specified, any carrier gas may be employed. Ammonia gas ($NH_3$) is used as a nitrogen source, and trimethylgallium ($Ga(CH_3)_3$: "TMG") is used as a gallium source. Trimethylindium ($In(CH_3)_3$: "TMI") is used as an indium source, and trimethylaluminum ($Al(CH_3)_3$: "TMA") is used as an aluminum source. Silane ($SiH_4$) is used as an n-type dopant gas, and bis(cyclopentadienyl)magnesium ($Mg(C_5H_5)_2$) is used as a p-type dopant gas.

5-1. n-Type Semiconductor Layer Formation Step

Firstly, a substrate 110 is cleaned with hydrogen gas. Then, an n-type semiconductor layer 120 is formed on the substrate 110. A buffer layer may be formed before the formation of the n-type semiconductor layer 120. In this procedure, the substrate temperature is 700° C. to 1,200° C.

5-2. Light-Emitting Layer Formation Step

Subsequently, a light-emitting layer 130 is formed on the n-type semiconductor layer 120. For example, an InGaN layer, a GaN layer, and an AlGaN layer are repeatedly deposited. In this procedure, the substrate temperature is 700° C. to 900° C.

5-3. p-Type Semiconductor Layer Formation Step

Then, a p-type semiconductor layer 140 is formed on the light-emitting layer 130. In this procedure, the substrate temperature is 800° C. to 1,200° C. The uppermost surface of the p-type semiconductor layer 140 is a p-type contact layer.

5-4. Current Blocking Layer Formation Step

Figure 9:
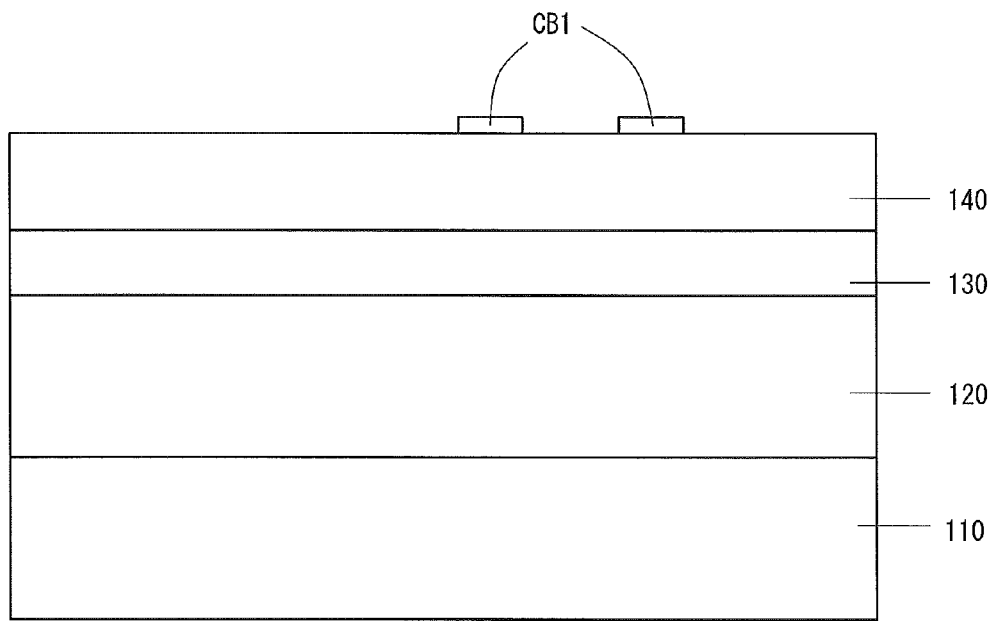
FIG. 9 is a view (part 1) showing a method for producing a light-emitting device according to Embodiment 1.

Next, as shown in FIG. 9, at least one current blocking layer CB1 is formed on a portion 140a of the p-type semiconductor layer 140. The portion 140a has a dot shape, and is disposed directly under the area where the p-electrode P1 is in contact with the transparent electrode TE1. For this purpose, a mask is formed by photolithography on a region except for the region where the current blocking layer CB1 is formed. The current blocking layer CB1 is formed through vapor deposition. Then, the mask is removed. Thus, the current blocking layer CB1 is formed as shown in FIG. 9.

5-5. Transparent Electrode Formation Step

Figure 10:
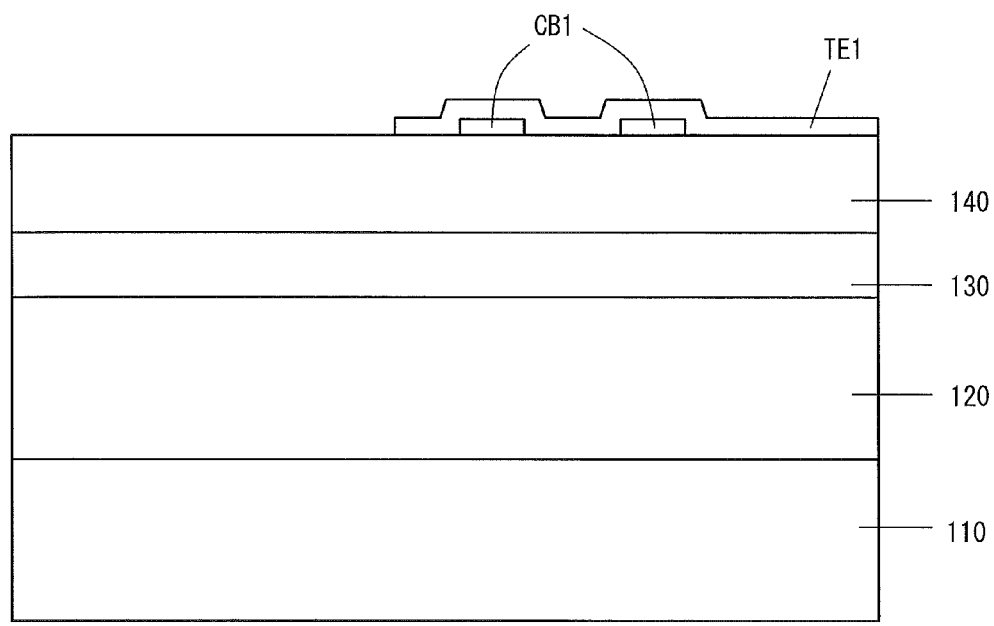
FIG. 10 is a view (part 2) showing the method for producing the light-emitting device according to Embodiment 1.

As shown in FIG. 10, a transparent electrode TE1 is formed in a planar shape on a remaining portion 140b of the p-type semiconductor layer 140 and the current blocking layer CB1. Firstly, a transparent electrode TE1 made of IZO is uniformly formed by sputtering IZO on the exposed portion of the p-type semiconductor layer 140 and the current blocking layer CB1. Subsequently, patterning is performed by photolithography. A region for exposing the n-type semiconductor layer 120 of the transparent electrode is removed by wet etching. Thereafter, heat treatment is preferably performed. Thus, as shown in FIG. 10, the transparent electrode TE1 is formed on the remaining portion 140b of the p-type semiconductor layer 140 and the current blocking layer CB1.

5-6. n-Type Semiconductor Layer Exposure Step

Figure 11:
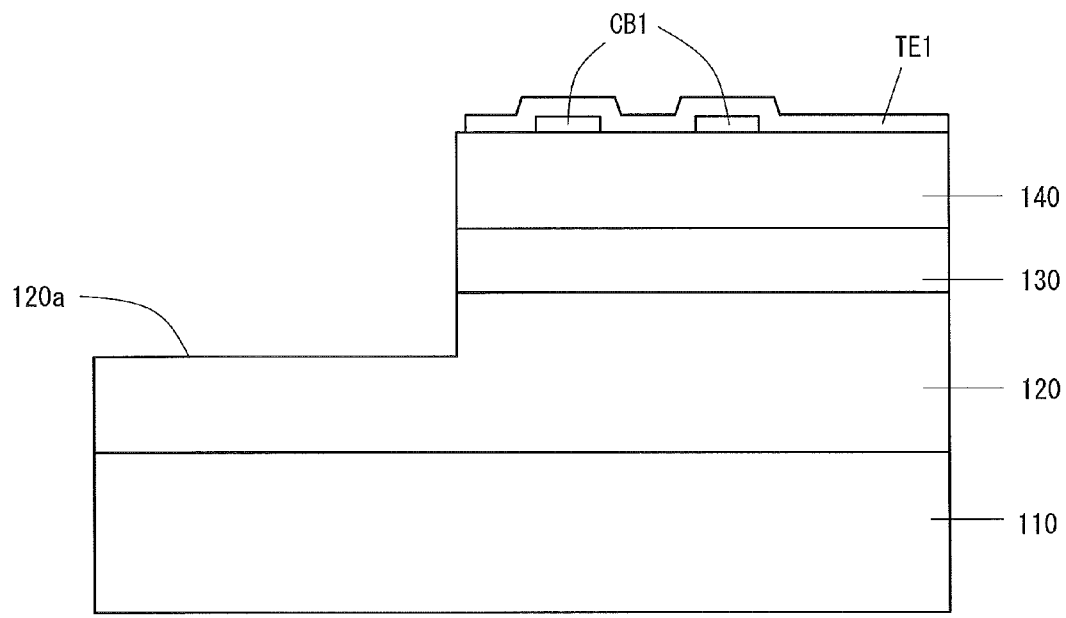
FIG. 11 is a view (part 3) showing the method for producing the light-emitting device according to Embodiment 1.

As shown in FIG. 11, a portion 120a of the n-type semiconductor layer 120 is exposed by removing a portion of the semiconductor layer from the p-type semiconductor layer 140. Laser may be employed instead of dry etching.

Thus, as shown in FIG. 11, the portion 120a of n-type semiconductor layer 120 is exposed.

5-7. Insulating Layer Formation Step

Figure 12:
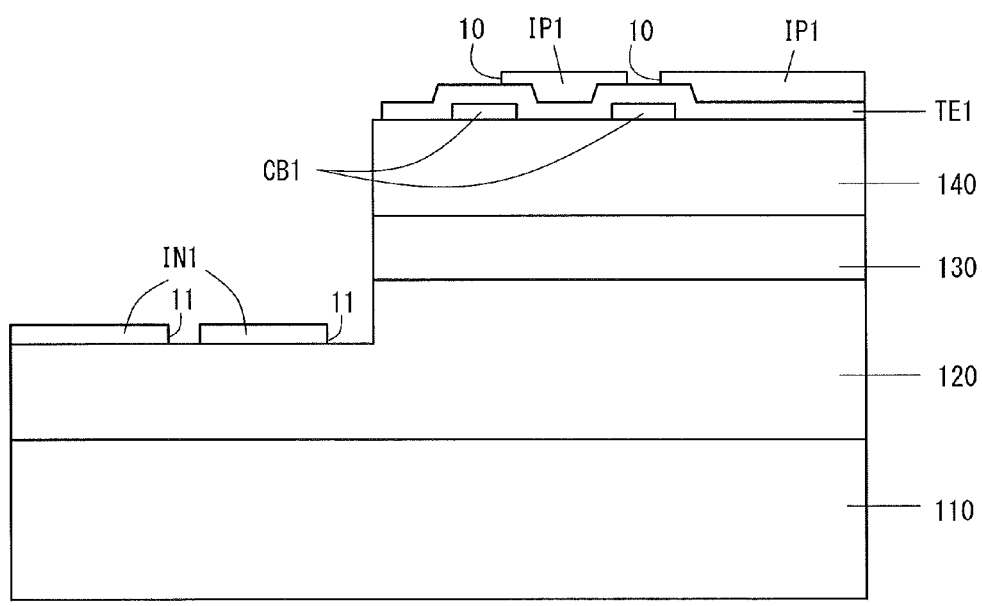
FIG. 12 is a view (part 4) showing the method for producing the light-emitting device according to Embodiment 1.

As shown in FIG. 12, photo resist patterns are formed on a portion of the transparent electrode TE1 and a portion of the n-type semiconductor layer 120. An insulating layer IP1 and an insulating layer IN1 are formed through vapor deposition on the region which is not covered with the photo resist. Then, the photo resist is removed. The insulating layers IP1 and IN1 are formed in a set of a plurality of short strip forms, thereby creating contact spaces 10 and 11 with no insulating layer formed between adjacent short strips. Thus, the insulating layer IP1 is formed on the transparent electrode TE1, and the insulating layer IN1 is formed on the n-type semiconductor layer 120.

5-8. p-Electrode Formation Step

Figure 13:
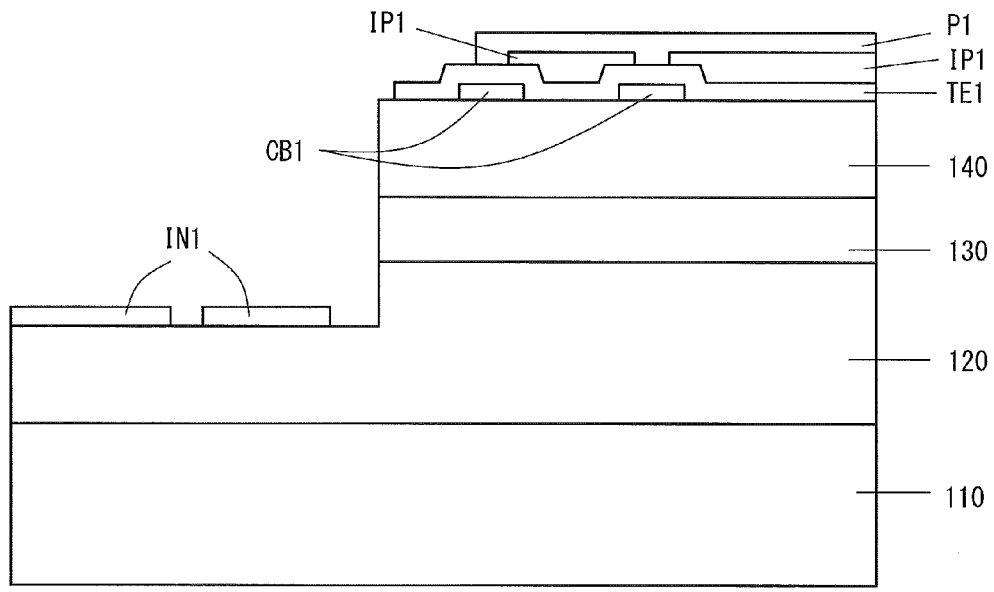
FIG. 13 is a view (part 5) showing the method for producing the light-emitting device according to Embodiment 1.

As shown in FIG. 13, a p-electrode P1 is formed in strip forms on the transparent electrode TE1 and the insulating layer IP1. For this purpose, photo resist is disposed. The p-electrode P1 is formed by sputtering. For example, on the transparent electrode TE1, α-IZO having a thickness of 5 nm, Ag alloy having a thickness of 100 nm, Ta having a thickness of 100 nm, Ti having a thickness of 50 nm are formed in this order. The p-electrode P1 extends in a strip form on the insulating layer IP1. The p-electrode P1 is electrically connected to the transparent electrode TE1 through the contact spaces 10.

Figure 14:
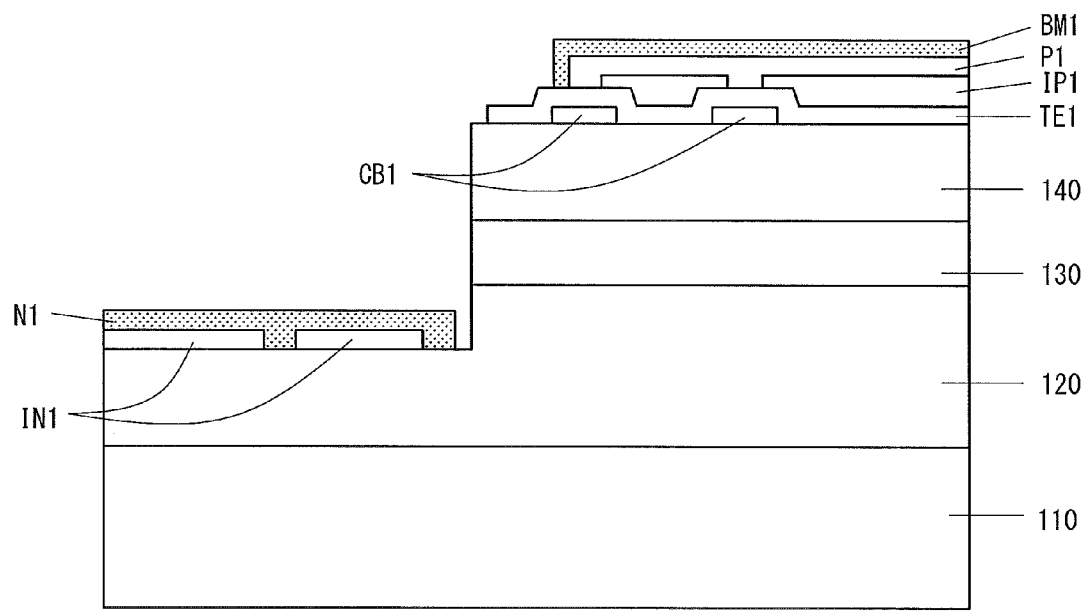
FIG. 14 is a view (part 6) showing the method for producing the light-emitting device according to Embodiment 1.

5-9. n-Electrode Formation Step and p-Side Barrier Metal Layer Formation Step As shown in FIG. 14, the n-electrode formation step and the p-side barrier metal layer formation step are performed in the same step. That is, in the n-electrode formation step and the p-side barrier metal layer formation step, the p-side barrier metal layer BM1 is formed on the p-electrode P1 while the n-electrode N1 is formed on the n-type semiconductor layer 120. The n-electrode N1 extends in a strip form on the insulating layer IN1. The n-electrode N1 is electrically connected to the n-type semiconductor layer 120 through the contact spaces 11. The n-electrode N1 and the p-side barrier metal layer BM1 are deposited in the same layered structure. Therefore, the n-electrode N1 and the A-side barrier metal layer BM1 after the formation has the same layered structure. The same layered structure means a structure in which a plurality of layers is deposited in the same order, and the thickness of each of the layers is the same.

For this purpose, firstly, a photo resist is formed on a region except for the region where the n-electrode N1 and the p-side barrier metal layer BM1 are formed. A film corresponding to the n-electrode N1 and the p-side barrier metal layer BM1 is formed by sputtering. For example, Ti having a thickness of 2 nm, Al alloy having a thickness of 100 nm, Ta having a thickness of 100 nm, Ti having a thickness of 300 nm, Pt having a thickness of 100 nm, Au having a thickness of 1,500 nm, and Al having a thickness of 10 nm are deposited in this order. Then, the photo resist is removed. Thus, the n-electrode N1 and the p-side barrier metal layer BM1 are formed as shown in FIG. 14.

5-10. Protective Film Formation Step

Next, a protective film F1 is formed. A uniform film is formed through CVD on the n-electrode N1, the p-side barrier metal layer BM1, and other layers. The p-pad electrode BM1c and the n-pad electrode N1c are exposed by dry etching. Thus, the protective film F1 is formed.

5-11. Other Steps

In addition to the aforementioned steps, additional steps such as a heat treatment may be carried out. In this way, the light-emitting device 100 in FIG. 1 is produced.

6. Effect of Embodiment 1

In the method for producing the light-emitting device 100 according to Embodiment 1, the n-electrode formation step and the p-side barrier metal layer formation step are combined into one step. That is, both the n-electrode N1 and the p-side barrier metal layer BM1 can be formed by performing the same step once. Therefore, the number of steps is smaller than that when the n-electrode N1 and the p-side barrier metal layer BM1 are formed separately. That is, the cycle time of producing the light-emitting device 100 is short.

Moreover, the light-emitting device 100 produced by the method for producing the semiconductor light-emitting device according to Embodiment 1 has the p-electrode P1 also serving as a reflective film. Therefore, the p-electrode P1 reflects the light from the light-emitting layer 130 toward the semiconductor layer. Thus, the light is hardly absorbed by the p-side barrier metal layer BM1.

7. Variation

7-1. Distributed Bragg Reflector (DBR)

At least one of the insulating layer IP1 and the insulating layer IN1 according to Embodiment 1 may be a Distributed Bragg Reflector (DBR). In that case, at least one of the insulating layer IP1 and the insulating layer IN1 reflects the light advancing toward at least one of the p-electrode P1 and the n-electrode N1. Needless to say, both the insulating layer IP1 and the insulating layer IN1 may be a Distributed Bragg Reflector (DBR). For this purpose, for example, a $SiO_2$ film and a $TiO_2$ film are alternately formed. Needless to say, other materials may be employed.

7-2. Flip-Chip Type, and Lift-Off Type

Embodiment 1 is applied to the face-up type light-emitting device 100. However, it can also be applied to other semiconductor light-emitting device. Needless to say, it can also be applied to, for example, a flip-chip type semiconductor light-emitting device having a light extraction surface on the substrate side or a semiconductor light-emitting device in which the growth substrate is removed through lift-off process.

7-3. Material of Transparent Electrode

In Embodiment 1, the transparent electrode TE1 is formed of IZO. However, transparent conductive oxide such as ITO, ICO, ZnO, $TiO_2$, $NbTiO_2$, and $TaTiO_2$ may be employed in place of IZO.

7-4. Conduction Type

In Embodiment 1, the first conduction type is n-type, and the second conduction type is p-type. However, the conduction type may be reversed. The case when the first conduction type is p-type and the second conduction type is n-type will be described in Embodiment 2.

8. Summary of Embodiment 1

As described hereinabove, in the method for producing the light-emitting device 100, the n-electrode formation step and the p-side barrier metal layer formation step are combined into one step. That is, both the n-electrode N1 and the p-side barrier metal layer BM1 are formed by performing the same step once. Therefore, the number of steps is smaller than that when the n-electrode N1 and the p-side barrier metal layer BM1 are formed separately. The cycle time of producing the light-emitting device 100 is short.

The light-emitting device 100 produced by the method for producing the semiconductor light-emitting device according to Embodiment 1 has the p-electrode P1 also serving as a reflective film. Therefore, the p-electrode P1 reflects the light from the light-emitting layer 130 toward the semiconductor layer. Thus, the light is hardly absorbed by the p-side barrier metal layer BM1. That is, the semiconductor light-emitting device has high extraction efficiency.

The aforementioned embodiment is merely examples. It is therefore understood that those skilled in the art can provide various modifications and variations of the technique, so long as those fall within the scope of the present technique. The layered structure of the layered body should not be limited to those as illustrated, and the layered structure, thickness, and other factors may be arbitrarily chosen. The semiconductor layer growth technique is not limited to metalorganic chemical vapor deposition (MOCVD), and other vapor phase epitaxy techniques and other liquid-phase epitaxy techniques may also be employed.

Embodiment 2

Embodiment 2 will next be described. In Embodiment 1, the n-electrode N1 and the p-side barrier metal layer BM1 are formed in the same step. On the other hand, in Embodiment 2, the p-electrode P1 and the n-side barrier metal layer BM2 are formed in the same step.

1. Semiconductor Light-Emitting Device

Figure 15:
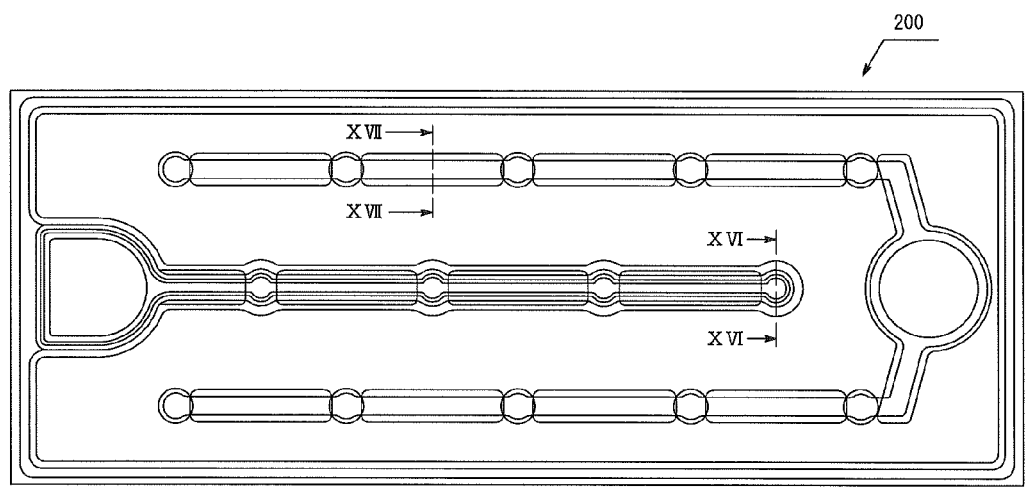
FIG. 15 is a plan view showing the structure of a light-emitting device according to Embodiment 2.

FIG. 15 is a plan view showing a light-emitting device 200 according to Embodiment 2. The light-emitting device 200 comprises an n-electrode N2 (refer to FIG. 16), an n-side barrier metal layer BM2 (refer to FIG. 16), and a p-electrode P2 (refer to FIG. 17) which will be described later, in addition to a substrate 110, an n-type semiconductor layer 120, a light-emitting layer 130, a p-type semiconductor layer 140, an insulating layer IN1, a current blocking layer CB1, a transparent electrode TE1, an insulating layer IP1, a protective film F1 as shown in FIG. 2.

2. Structure in the Vicinity of Electrode

2-1. Structure in the Vicinity of n-Electrode

Figure 16:
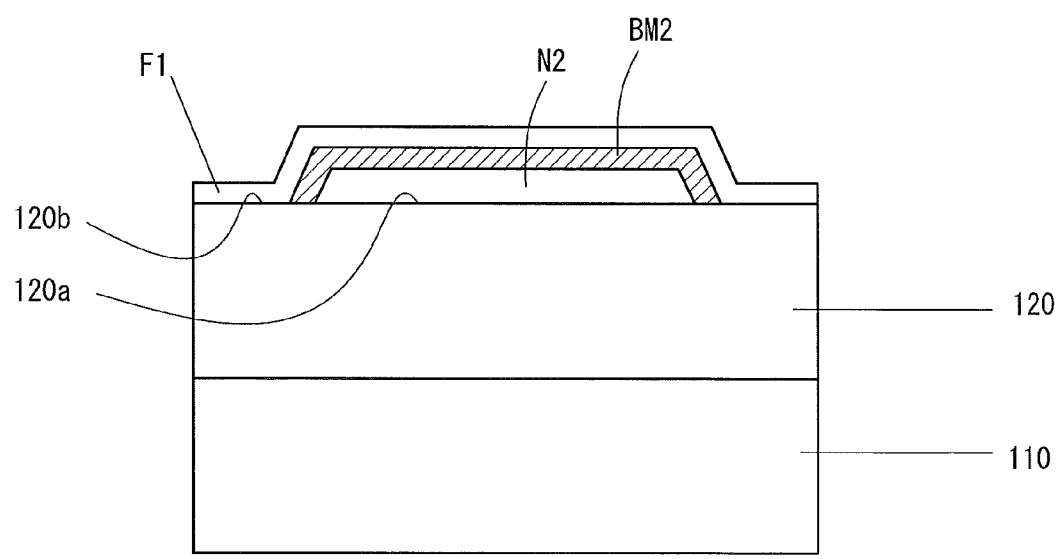
FIG. 16 is a cross-sectional view showing a XVI-XVI cross section of FIG. 15.

FIG. 16 is a cross-sectional view showing a XVI-XVI cross section of FIG. 15. As shown in FIG. 16, the n-electrode N2 is formed on a portion 120a of the n-type semiconductor layer 120. The n-side barrier metal layer BM2 is formed on the n-electrode N2. The n-side barrier metal layer BM2 completely covers the surface of the n-electrode N2. That is, the n-side barrier metal layer BM2 and the n-type semiconductor layer 120 completely cover the n-electrode N2. The protective film F1 is formed on the n-side barrier metal layer BM2 and a remaining portion 120b of the n-type semiconductor layer 120. The material of the n-electrode N2 will be described later. The protective film F1 is formed of, for example, $SiO_2$. The protective film F1 may be formed of other insulating transparent film in place of $SiO_2$.

The n-electrode N2 has an electrode layer containing at least one of Ag and Al. The electrode layer is a reflective electrode layer having a thickness of 50 nm or more, and formed of Ag or Al, or an alloy of these materials. The reflective electrode layer is a layer to reflect light. The thickness of the reflective electrode layer is preferably 50 nm to suitably reflect light.

2-2. Structure in the Vicinity of p-Electrode

Figure 17:
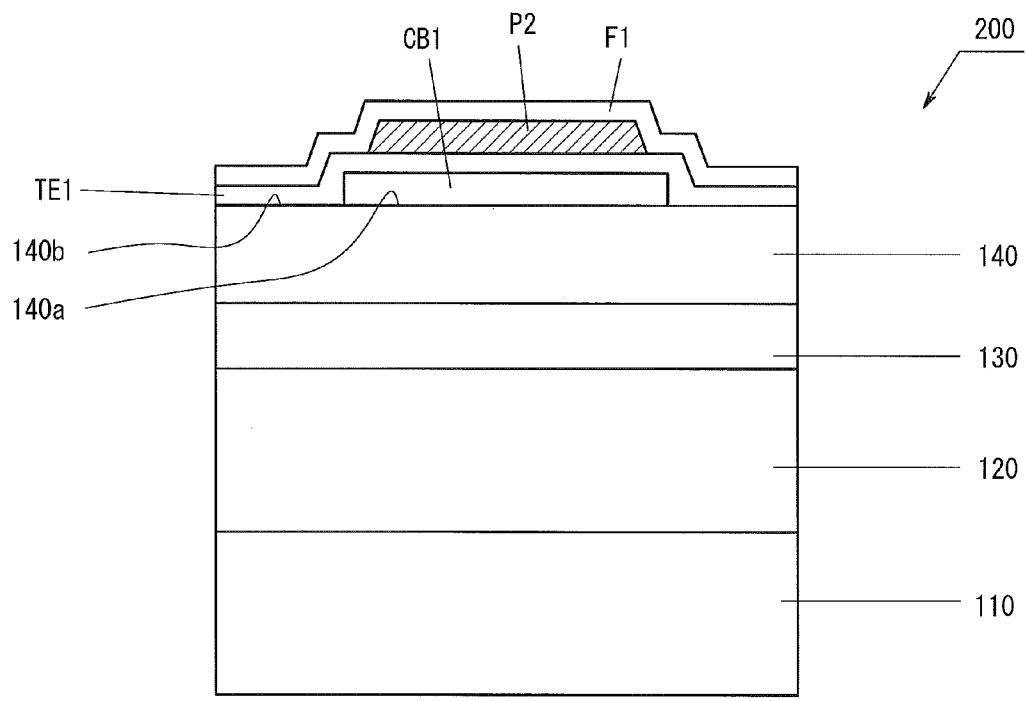
FIG. 17 is a cross-sectional view showing a XVII-XVII cross section of FIG. 15.

FIG. 17 is a cross-sectional view showing a XVII-XVII cross section of FIG. 15. As shown in FIG. 17, the current blocking layer CB1 is disposed on a portion 140a of the p-type semiconductor layer 140. The transparent electrode TE1 is disposed on the current blocking layer CB1 and the remaining portion 140b of the p-type semiconductor layer 140. The p-electrode P2 is disposed on the transparent electrode TE1. When the p-electrode P2 is projected on the surface of the p-type semiconductor layer 140, its projection area is included in an area where the current blocking layer CB1 is formed.

3. n-Side Barrier Metal Layer and p-Electrode

3-1. Layered Structure of n-Side Barrier Metal Layer and p-Electrode

As shown by the hatched area of FIGS. 16 and 17, the layered structure of the n-side barrier metal layer BM2 of FIG. 16 is the same as the layered structure of the p-electrode P2 of FIG. 17. As described later, the n-side barrier metal layer BM2 and the p-electrode P2 are formed in the same step. Therefore, in the n-side barrier metal layer BM2 and the p-electrode P2, the layers are formed in the same order sequentially from the lower layer, and the thickness of each of the layers deposited is also the same within the film formation error range.

3-2. Materials of n-Side Barrier Metal Layer and p-Electrode

3-2-1. Example 4

Next will be described the materials of the n-electrode N2, the n-side barrier metal layer BM2, and the p-electrode P2. In Example 4 of Table 2, the n-electrode N2 is formed of Ti, Ag alloy, Ta, and Ti deposited in this order on the n-type semiconductor layer 120. The thickness of Ti in contact with the n-type semiconductor layer 120 is 2 nm. The thickness of Ag alloy is 100 nm. The thickness of Ta is 100 nm. The thickness of Ti is 50 nm. The thicknesses of these layers are merely examples, and other thickness may be used.

The n-side barrier metal layer BM2 is formed of Ti, Rh, Ti, Au, Al deposited in this order on the n-electrode N2. The thickness of Ti is 2 nm. The thickness of Rh is 100 nm. The thickness of Ti is 50 nm. The thickness of Au is 1500 nm. The thickness of Al is 10 nm. The thicknesses of these layers are merely examples, and other thickness may be used.

The layers of the p-electrode P2 of Example 4 are deposited in the same order as that of the layers of the n-side barrier metal layer BM2 of Example 4. The p-electrode P2 is formed of Ti, Rh, Ti, Au, and Al deposited in this order on the transparent electrode TE1. The thickness of Ti is 2 nm. The thickness of Rh is 100 nm. The thickness of Ti is 50 nm. The thickness of Au is 1,500 nm. The thickness of Al is 10 nm. The thicknesses of these layers are merely examples, and other thickness may be used.

3-2-2. Example 5

In Example 5 of Table 2, the n-electrode N2 is formed of Ti, Al, Ta, and Ti deposited in this order on the n-type semiconductor layer 120. The thickness of Ti in contact with the n-type semiconductor layer 120 is 2 nm. The thickness of Al is 100 nm. The thickness of Ta is 100 nm. The thickness of Ti is 50 nm. The thicknesses of these layers are merely examples, and other thickness may be used.

The n-side barrier metal layer BM2 of Example 5 is the same as the n-side barrier metal layer BM2 of Example 4.

The layers of the p-electrode P2 of Example 5 are deposited in the same order as that of the layers of the n-side barrier metal layer BM2 of Example 5.

TABLE 2

|  |  | n-type barrier metal layer and p-electrode | n-electrode |
|---|---|---|---|
| Example 4 | Material | Ti/Rh/Ti/Au/Al | Ti/Ag alloy/Ta/Ti |
|  | Thickness (nm) | 2/100/50/1500/10 | 2/100/100/50 |
| Example 5 | Material | Ti/Rh/Ti/Au/Al | Ti/Al/Ta/Ti |
|  | Thickness (nm) | 2/100/50/1500/10 | 2/100/100/50 |

4. Method for Producing Semiconductor Light-Emitting Device

In Embodiment 2, the n-electrode formation step, the p-electrode formation step, and the n-side barrier metal layer formation step are different from Embodiment 1. Therefore, only the different steps are described. The steps up to the insulating layer formation step of FIG. 12 are the same as those of Embodiment 1.

4-1. n-Electrode Formation Step

Figure 18:
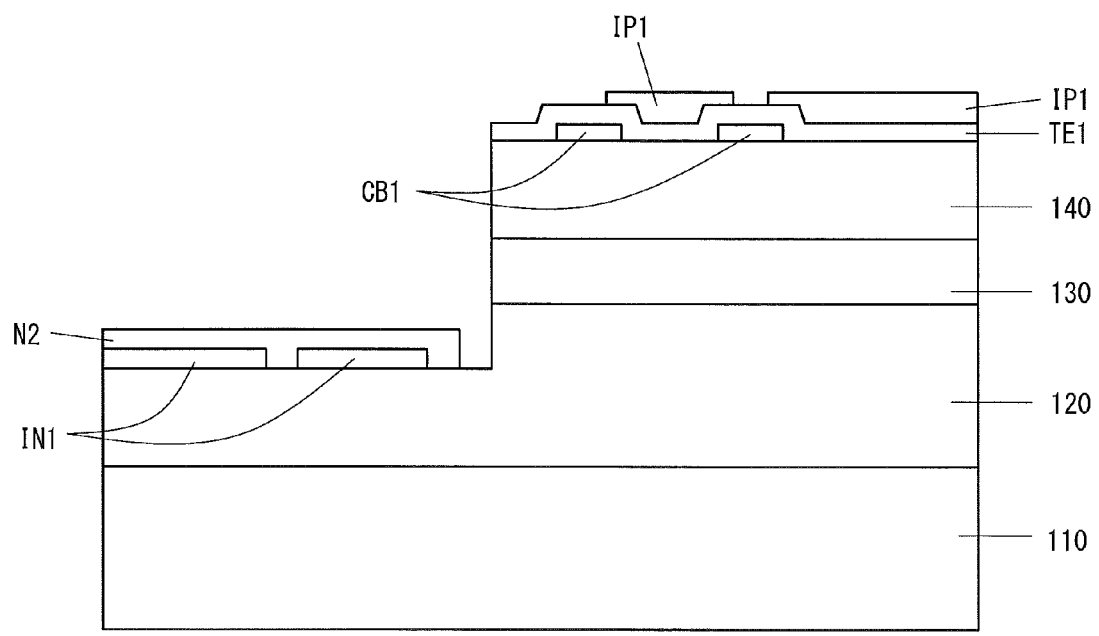
FIG. 18 is a view (part 1) showing a method for producing a light-emitting device according to Embodiment 2.

As shown in FIG. 18, an n-electrode N2 is formed on the n-type semiconductor layer 120 and the insulating layer IN1. For example, on the n-type semiconductor layer 120, Ti having a thickness of 2 nm, Al having a thickness of 100 nm, Ta having a thickness of 100 nm, and Ti having a thickness of 50 nm are deposited in this order shown as Example 5.

Figure 19:
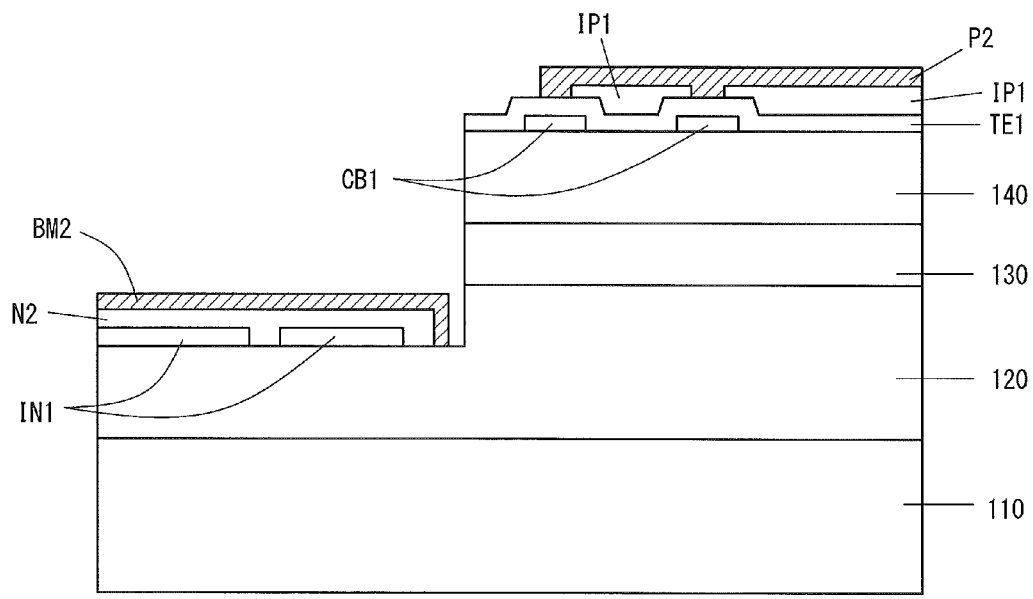
FIG. 19 is a view (part 2) showing the method for producing the light-emitting device according to Embodiment 2.

4-2. p-Electrode Formation Step and n-Side Barrier Metal Layer Formation Step Subsequently, as shown in FIG. 19, the p-electrode formation step and the n-side barrier metal layer formation step are performed in the same step. That is, in the p-electrode formation step and the n-side barrier metal layer formation step, the n-side barrier metal layer BM2 is formed on the n-electrode N2 while the p-electrode P2 is formed on the transparent electrode TE1. When the p-electrode P2 and the n-side barrier metal layer BM2 are deposited, each of the layers of the p-electrode P2 and the n-side barrier metal layer BM2 is formed in the same order and in the same thickness. Therefore, the p-electrode P2 and the n-side barrier metal layer BM2 after the film formation have the same layered structure.

Embodiment 3

Embodiment 3 will next be described, focusing on the differences from Examples 1 and 2.

1. Semiconductor Light-Emitting Device

Figure 20:
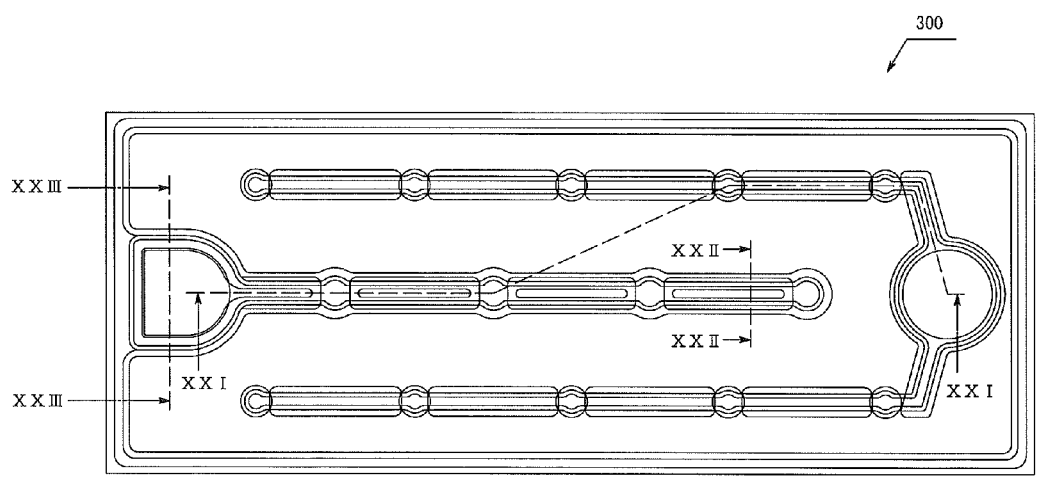
FIG. 20 is a plan view showing the structure of a light-emitting device according to Embodiment 3.
Figure 21:
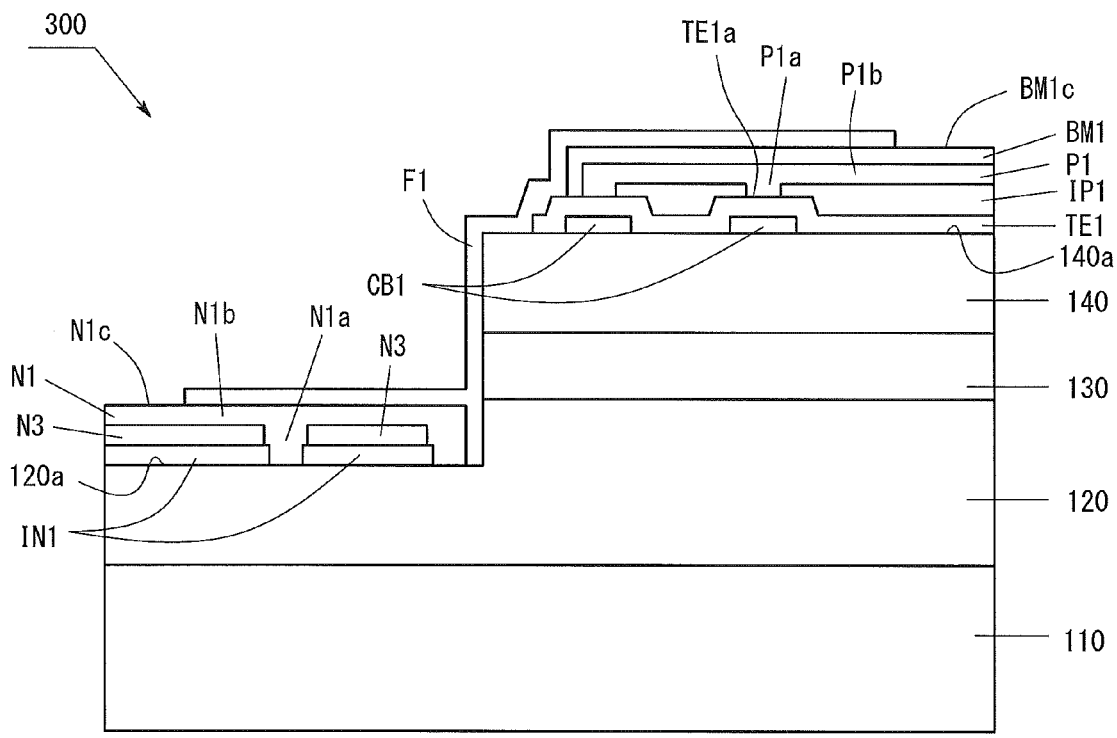
FIG. 21 is a cross-sectional view showing a XXI-XXI cross section of FIG. 20.

FIG. 20 is a plan view showing the structure of a light-emitting device 300 according to Embodiment 3. FIG. 21 is a cross-sectional view showing a XXI-XXI cross section of FIG. 20. As shown in FIG. 21, the light-emitting device 300 has a substrate 110, an n-type semiconductor layer 120, a light-emitting layer 130, a p-type semiconductor layer 140, an insulating layer IN1, a current blocking layer CB1, a transparent electrode TE1, an insulating layer IP1, an n-side metal layer N3, an n-electrode N1, a p-electrode P1, a p-side barrier metal layer BM1, and a protective film F1.

2. Structure in the Vicinity of Electrode

Figure 22:
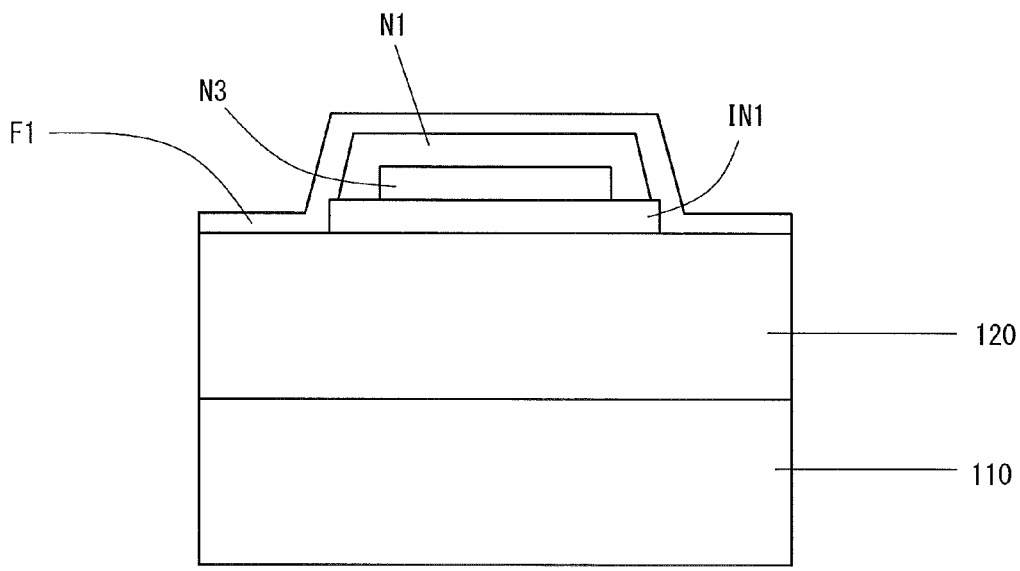
FIG. 22 is a cross-sectional view showing a XXII-XXII cross section of FIG. 20.

FIG. 22 is a cross-sectional view showing a XXII-XXII cross section of FIG. 20. As shown in FIG. 22, the insulating layer IN1 is formed on the n-type semiconductor layer 120. The n-side metal layer N3 is formed on the insulating layer IN1. The n-electrode N1 is formed on the n-side metal layer N3 with covering the surface thereof. The protective film F1 is formed on the n-electrode N1. That is, the n-side metal layer N3 is covered with the insulating layer IN1 and the n-electrode N1.

Figure 23:
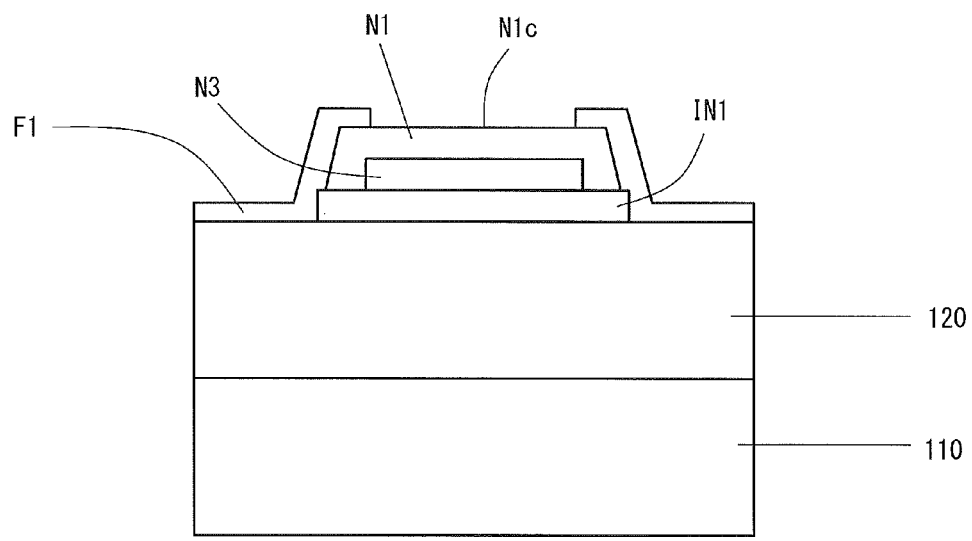
FIG. 23 is a cross-sectional view showing a XXIII-XXIII cross section of FIG. 20.

FIG. 23 is a cross-sectional view showing a XXIII-XXIII cross section of FIG. 20. As shown in FIG. 22, the insulating layer IN1 is formed on the n-type semiconductor layer 120. The n-side metal layer N3 is formed on the insulating layer IN1. The n-electrode N1 is formed on the n-side metal layer N3. An n-pad electrode N1c of the n-electrode N1 is exposed without being covered with the protective film F1.

3. Method for Producing Semiconductor Light-Emitting Device

In Example 3, the p-electrode formation step, the n-side metal layer formation step, the n-electrode formation step, and the p-side barrier metal layer formation step are different from Embodiment 1. Therefore, only the different steps will be described. The steps up to the insulating layer formation step of FIG. 12 are the same as those of Embodiment 1.

3-1. p-Electrode Formation Step and n-Side Metal Layer Formation Step

Figure 24:
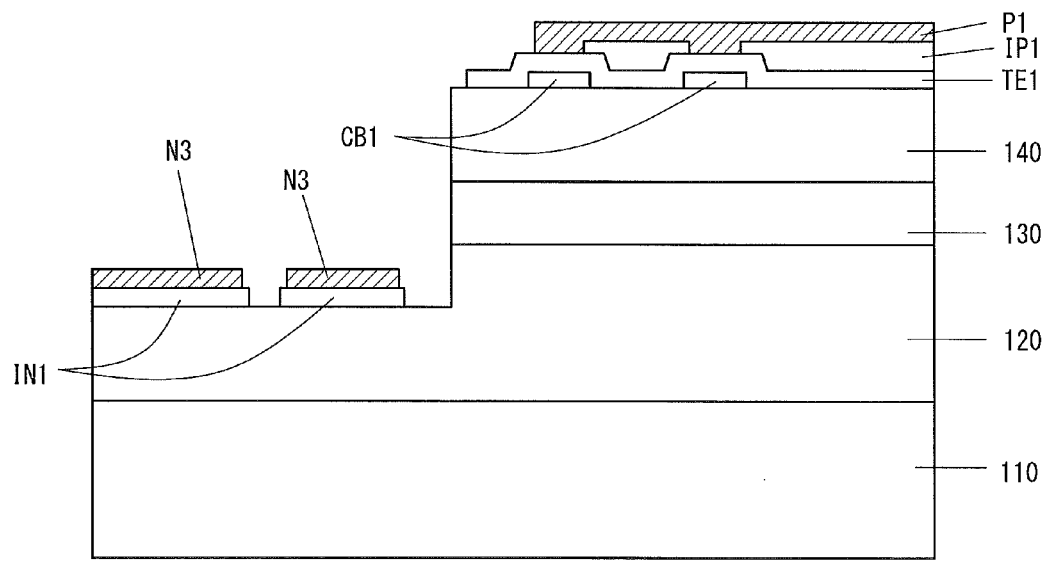
FIG. 24 is a view (part 1) showing a method for producing a light-emitting device according to Embodiment 3.

Subsequently, as shown in FIG. 24, the p-electrode formation step and the n-side metal layer formation step are performed in the same step. That is, in the p-electrode formation step and the n-side metal layer formation step, the n-side metal layer N3 is formed don the insulating layer IN1 while the p-electrode P1 is formed on the transparent electrode TE1 and the insulating layer IP1. When the p-electrode P1 and the n-side metal layer N3 are deposited, each of the layers of p-electrode P1 and the n-side metal layer N3 is formed in the same order and in the same thickness. Therefore, the p-electrode P1 and the n-side metal layer N3 after the film formation have the same layered structure.

Figure 25:
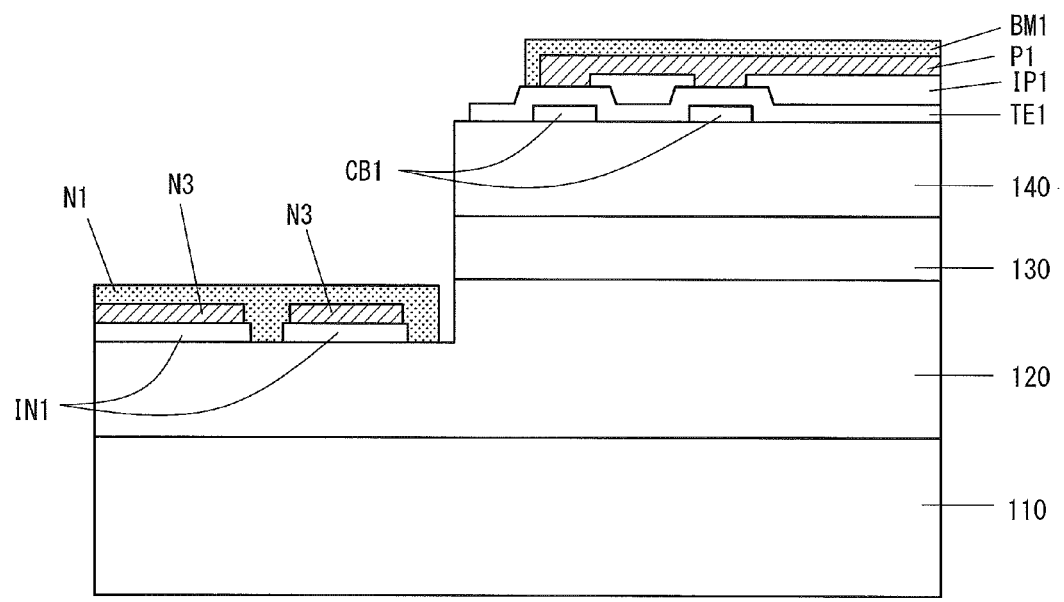
FIG. 25 is a view (part 2) showing the method for producing the light-emitting device according to Embodiment 3.

3-2. n-Electrode Formation Step and p-Side Barrier Metal Layer Formation Step Then, as shown in FIG. 25, the n-electrode formation step and the p-side barrier metal layer formation step are performed in the same step. In the n-electrode formation step and the p-side barrier metal layer formation step, the p-side barrier metal layer BM1 is formed on the p-electrode P1 while the n-electrode N1 is formed on the n-side metal layer N3. When the n-electrode N1 and the p-side barrier metal layer BM1 are deposited, each of the layers of the n-electrode N1 and the p-side barrier metal layer BM1 is formed in the same order and in the same thickness. The n-electrode N1 and the p-side barrier metal layer BM1 after the film formation have the same layered structure.

Embodiment 4

Embodiment 4 will next be described, focusing on the differences from Examples 1 and 2.

1. Semiconductor Light-Emitting Device

Figure 26:
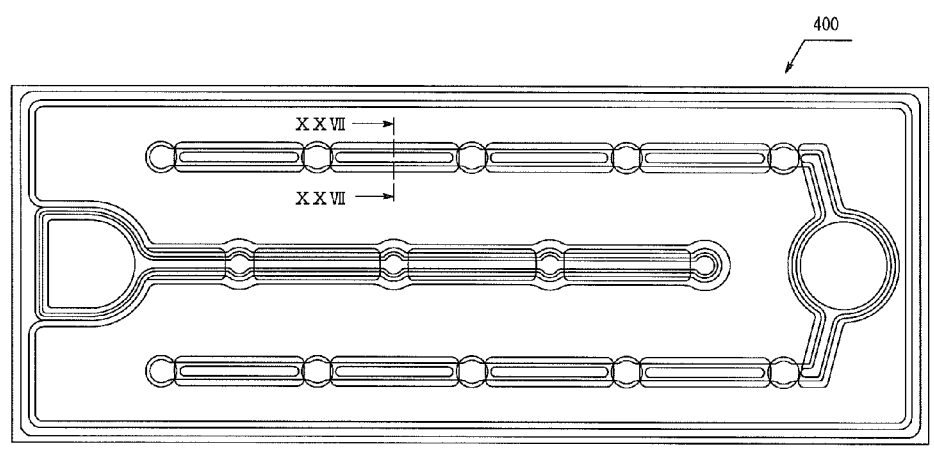
FIG. 26 is a plan view showing the structure of a light-emitting device according to Embodiment 4.
Figure 27:
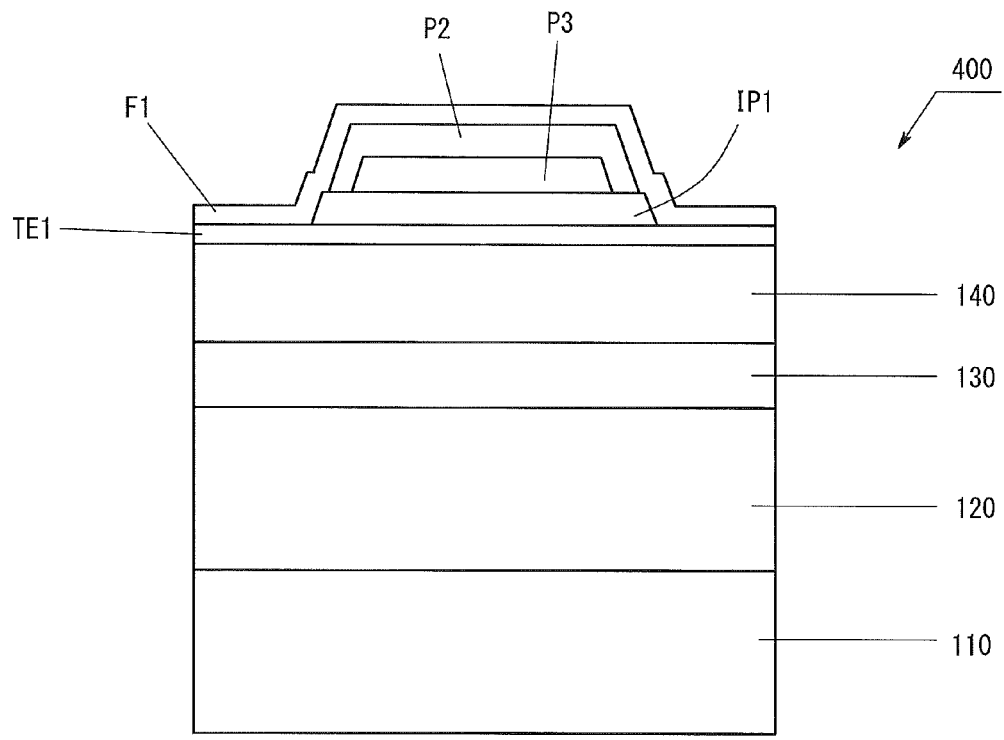
FIG. 27 is a cross-sectional view showing a XXVII-XXVII cross section of FIG. 26.

FIG. 26 is a plan view showing the structure of a light-emitting device according 400 to Embodiment 4. FIG. 27 is a cross-sectional view showing a XXVII-XXVII cross section of FIG. 26. As shown in FIG. 27, the light-emitting device 400 has a substrate 110, an n-type semiconductor layer 120, a light-emitting layer 130, a p-type semiconductor layer 140, a transparent electrode TE1, an insulating layer IP1, a protective film F1, a p-side metal layer P3, and a p-electrode P2. The light-emitting device 400 has an insulating layer IN1, a current blocking layer CB1, and an n-electrode N1 as shown in FIG. 2.

2. Structure in the Vicinity of Electrode

As shown in FIG. 27, the insulating layer IP1 is formed on the transparent electrode TE1. The p-side metal layer P3 is formed on the insulating layer IP1. The p-electrode P2 is formed on the p-side metal layer P3. The protective film F1 is formed on the p-electrode P2. That is, the p-side metal layer P3 is covered with the insulating layer IP1 and the p-electrode P2.

3. Method for Producing Semiconductor Light-Emitting Device

In Embodiment 4, the n-electrode formation step, the A-side metal layer formation step, the p-electrode formation step, and the n-side barrier metal layer formation step are different from Embodiment 1. Therefore, only the different steps will be described. The steps up to the insulating layer formation step of FIG. 12 are the same as those of Embodiment 1.

3-1. n-Electrode Formation Step and p-Side Metal Layer Formation Step

Figure 28:
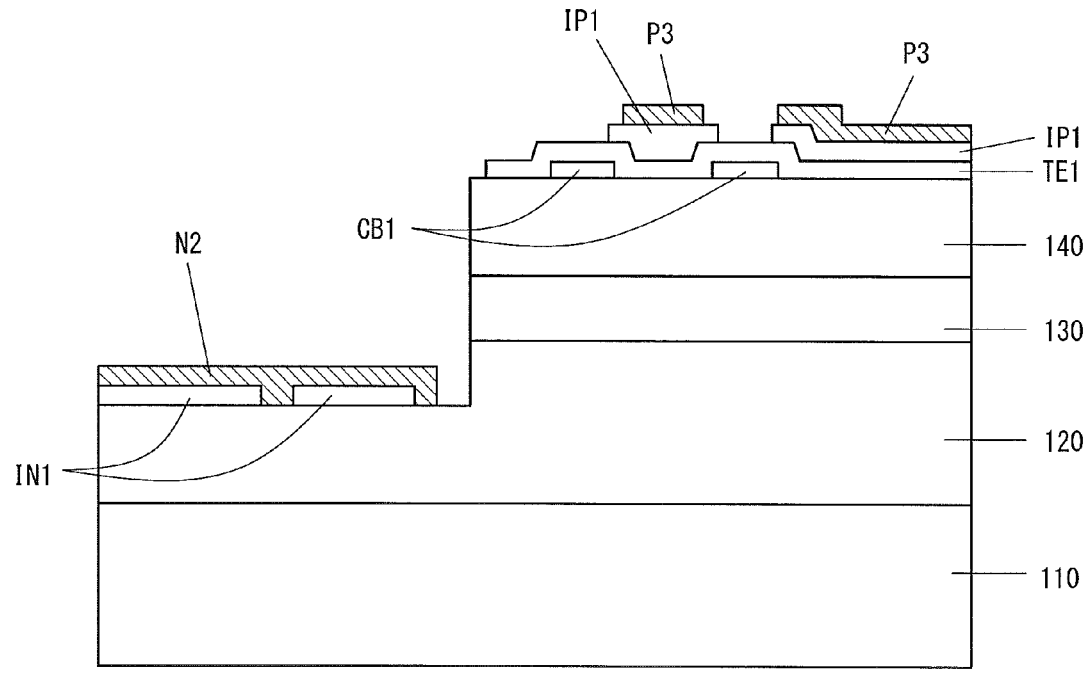
FIG. 28 is a view (part 1) showing a method for producing a light-emitting device according to Embodiment 4.

Subsequently, as shown in FIG. 28, the n-electrode formation step and the p-side metal layer formation step are performed in the same step. That is, in the n-electrode formation step and the p-side metal layer formation step, the p-side metal layer P3 is formed on the insulating layer IP1 while the n-electrode N2 is formed on the n-type semiconductor layer 120 and the insulating layer IN1. Each of the layers of the n-electrode N2 and the p-side metal layer P3 is formed in the same order and in the same thickness. Therefore, the n-electrode N2 and the p-side metal layer P3 after the film formation have the same layered structure.

Figure 29:
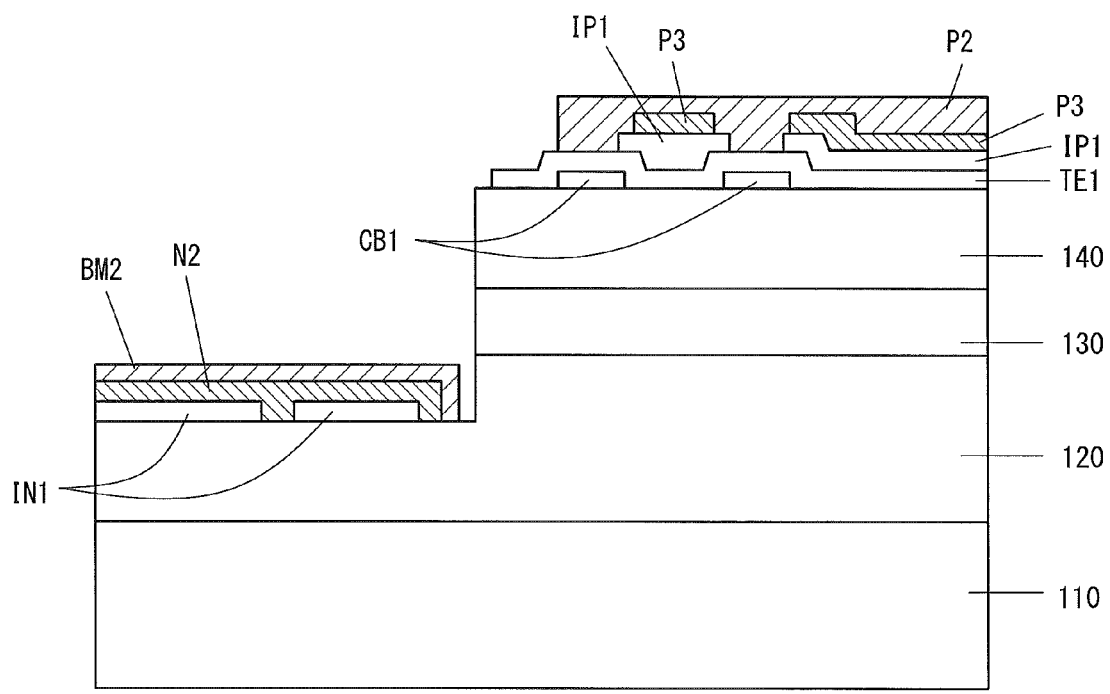
FIG. 29 is a view (part 2) showing the method for producing the light-emitting device according to Embodiment 4.

3-2. p-Electrode Formation Step and n-Side Barrier Metal Layer Formation Step Then, as shown in FIG. 29, the p-electrode formation step and the n-side barrier metal layer formation step are performed in the same step. That is, in the p-electrode formation step and the n-side barrier metal layer formation step, the n-side barrier metal layer BM2 is formed on the n-electrode N2 while the p-electrode P2 is formed on the A-side metal layer P3. When the p-electrode P2 and the n-side barrier metal layer BM2 are deposited, each of the layers of the p-electrode P2 and the n-side barrier metal layer BM2 is formed in the same order and in the same thickness. Therefore, the p-electrode P2 and the n-side barrier metal layer BM2 after the film formation have the same layered structure.

What is claimed is:

1. A method for producing a Group III nitride semiconductor light-emitting device comprising an n-type semiconductor layer, a light-emitting layer, and a p-type semiconductor layer, the method comprising:
    forming an n-electrode to be electrically connected to the n-type semiconductor layer;
    forming a transparent electrode contacted with and on the p-type semiconductor layer;
    forming a p-electrode to be electrically contacted with the transparent electrode;
    forming a p-electrode side barrier metal layer on the p-electrode such that the p-electrode side barrier metal layer and the transparent electrode completely cover the p-electrode;
    forming a p-side insulating layer with a p-side contact space on the transparent electrode; and
    forming at least one current blocking layer on a portion of the p-type semiconductor layer and right under the p-side contact space;
    wherein:
    the p-electrode has an electrode layer containing at least one of Ag and Al;
    in the forming the n-electrode and the forming the p-electrode side barrier metal layer, the p-electrode side barrier metal layer is formed on the p-electrode while the n-electrode to be electrically connected to the n-type semiconductor layer is formed;
    the n-electrode and the p-electrode side barrier metal layer are deposited in the same layered structure; and
    the p-electrode comprises a p-wiring electrode and a p-contact electrode, in the forming the p-electrode, forming the p-wiring electrode on the p-side insulating layer and forming the p-contact electrode which contacts with the transparent electrode through the p-side contact space.

2. The method for forming the Group III nitride semiconductor light-emitting device according to claim 1, the method comprising:
    forming a first metal layer between the n-type semiconductor layer and the n-electrode; wherein
    in the forming the first metal layer and the forming the p-electrode, the p-electrode is formed while the first metal layer is formed; and
    the first metal layer and the p-electrode are deposited in the same layered structure.

3. The method for forming the Group III nitride semiconductor light-emitting device according to claim 1, the method comprising:
forming an n-side insulating layer with an n-side contact space on the n-type semiconductor layer, wherein the n-electrode comprises an n-wiring electrode and an n-contact electrode, in the forming the n-electrode, forming the n-wiring electrode on the n-side insulating layer and forming the n-contact electrode which contacts with the n-type semiconductor layer through the n-side contact space.

4. The method for forming the Group III nitride semiconductor light-emitting device according to claim 3, wherein in the forming the n-side insulating layer, a distributed Bragg reflector film is formed as the n-side insulating layer.

5. A method for producing a Group III nitride semiconductor light-emitting device comprising an n-type semiconductor layer, a light-emitting layer, and a p-type semiconductor layer, the method comprising:
forming an n-electrode to be electrically connected to the n-type semiconductor layer;
forming a transparent electrode contacted with and on the p-type semiconductor layer;
forming a p-electrode to be electrically contacted with the transparent electrode;
forming an n-electrode side barrier metal layer on the n-electrode such that the n-electrode side barrier metal layer and the n-type semiconductor layer completely cover the n-electrode;
forming a p-side insulating layer with a p-side contact space on the transparent electrode; and
forming at least one current blocking layer on a portion of the p-type semiconductor layer and right under the p-side contact space;
wherein:
the n-electrode has an electrode layer containing at least one of Ag and Al;
in the forming the p-electrode and the forming the n-electrode side barrier metal layer, the n-electrode side barrier metal layer is formed on the n-electrode while the p-electrode to be electrically connected to the transparent electrode is formed;
the p-electrode and the n-electrode side barrier metal layer are deposited in the same layered structure; and
the p-electrode comprises a p-wiring electrode and a p-contact electrode, in the forming the p-electrode, forming the p-wiring electrode on the p-side insulating layer and forming the p-contact electrode which contacts with the transparent electrode through the p-side contact space.

6. The method for forming the Group III nitride semiconductor light-emitting device according to claim 5, the method comprising:
forming an n-side insulating layer with the n-side contact space on the n-type semiconductor layer, wherein the n-electrode is formed on the n-side insulating layer and contacts with the n-type semiconductor layer through the n-side contact space.

7. The method for forming the Group III nitride semiconductor light-emitting device according to claim 6, wherein in the forming the n-side insulating layer, a distributed Bragg reflector film is formed as the n-side insulating layer.

8. The method for forming the Group III nitride semiconductor light-emitting device according to claim 5, wherein the n-electrode side barrier metal layer comprises a set of Ti, Rh, Ti, Au, Al deposited in this order on the n-electrode.

9. A method for producing a Group III nitride semiconductor light-emitting device comprising an n-type semiconductor layer, a light-emitting layer, and a p-type semiconductor layer, the method comprising:
forming an n-electrode to be electrically connected to the n-type semiconductor layer;
forming a transparent electrode contacted with and on the p-type semiconductor layer;
forming a p-electrode to be electrically contacted with the transparent electrode; and
forming a p-electrode side barrier metal layer on the p-electrode such that the p-electrode side barrier metal layer and the transparent electrode completely cover the p-electrode;
wherein:
the p-electrode has an electrode layer containing at least one of Ag and Al;
in the forming the n-electrode and the forming the p-electrode side barrier metal layer, the p-electrode side barrier metal layer is formed on the p-electrode while the n-electrode to be electrically connected to the n-type semiconductor layer is formed;
the n-electrode and the p-electrode side barrier metal layer are deposited in the same layered structure; and
the p-electrode side barrier metal layer comprises at least one set selected from a group consisting of a set of Ti, Al alloy, Ta, Ti, Pt, Au, and Al and a set of Ti, Rh, Ti, Au, and Al, deposited in this order on the p-electrode.

10. A Group III nitride semiconductor light-emitting device comprising:
an n-type semiconductor layer;
a light-emitting layer;
a p-type semiconductor layer;
an n-electrode to be electrically connected to the n-type semiconductor layer;
a transparent electrode contacted with and on the p-type semiconductor layer;
a p-electrode containing at least one of Ag and Al to be electrically connected to the p-type semiconductor layer; and
a p-electrode side barrier metal layer formed on the p-electrode such that the p-electrode side barrier metal layer and the transparent electrode completely cover the p-electrode;
a p-side insulating layer with a p-side contact space on the transparent electrode; and
current blocking layers between the p-type semiconductor layer and the transparent electrode and right under the p-side contact space;
wherein:
the p-electrode side barrier metal layer has the same layered structure as that of the n-electrode; and
the p-electrode comprises a p-wiring electrode and a p-contact electrode, the p-wiring electrode is formed on the p-side insulating layer and the p-contact electrode contacts with the transparent electrode through the p-side contact space.

11. The Group III nitride semiconductor light-emitting device according to claim 10, further comprising:
an n-side insulating layer with an n-side contact space on the n-type semiconductor layer,
wherein the n-electrode comprises an n-wiring electrode and an n-contact electrode, the n-wiring electrode is formed on the n-side insulating layer and the n-contact electrode contacts with the n-type semiconductor layer through the n-side contact space.

\* \* \* \* \*